US006949989B2

(12) United States Patent
Panetta et al.

(10) Patent No.: US 6,949,989 B2
(45) Date of Patent: Sep. 27, 2005

(54) ELECTRONIC SIGNAL FILTER INCLUDING SOLDERLESS GROUND CLIP HAVING SURGE PROTECTION AND SHIELDING FEATURES

(75) Inventors: Carlo L. Panetta, Chittenango, NY (US); Joseph N. Maguire, Syracuse, NY (US); Joseph A. Zennamo, Jr., Skaneateles, NY (US)

(73) Assignee: Eagle Comtronics, Inc., Clay, NY (US)

(*) Notice: Subject to any disclaimer, the term of this patent is extended or adjusted under 35 U.S.C. 154(b) by 0 days.

(21) Appl. No.: 10/821,261

(22) Filed: Apr. 8, 2004

(65) Prior Publication Data

US 2004/0227589 A1 Nov. 18, 2004

Related U.S. Application Data

(60) Provisional application No. 60/461,174, filed on Apr. 8, 2003.

(51) Int. Cl.[7] .................................................. H03H 7/01
(52) U.S. Cl. ....................................... 333/185; 333/175
(58) Field of Search ................................ 333/175, 176, 333/184, 185; 439/620, 587

(56) References Cited

U.S. PATENT DOCUMENTS

| | | | | | |
|---|---|---|---|---|---|
| 4,451,803 | A | * | 5/1984 | Holdsworth et al. | 333/12 |
| 4,701,726 | A | * | 10/1987 | Holdsworth | 333/185 |
| 6,429,754 | B1 | | 8/2002 | Zennamo, Jr. et al. | |
| 6,560,087 | B1 | | 5/2003 | Zennamo, Jr. et al. | |
| 6,674,342 | B2 | | 1/2004 | Zennamo, Jr. et al. | |
| 6,759,927 | B2 | | 7/2004 | Maguire et al. | |
| 2003/0151470 | A1 | | 8/2003 | Zennamo, Jr. et al. | |

* cited by examiner

*Primary Examiner*—Seungsook Ham
(74) *Attorney, Agent, or Firm*—Burr & Brown

(57) ABSTRACT

An electronic signal filter is provided, including a first filter housing member, a second filter housing member, and a circuit board positioned within a filter cavity. The circuit board includes a slot. A ground clip is also provided, including a slot-retaining portion positioned within the circuit board slot, at least one grounding arm in solderless grounding contact with at least an inner surface of the second filter housing member, and at least one grounding leg. Upon assembly, at least a portion of the grounding leg is positioned in an interface between the first and the second filter housing members to achieve a secure ground contact between the circuit board, the first filter housing member, and the second filter housing member in a solderless manner.

77 Claims, 11 Drawing Sheets

41

ELECTRONIC SIGNAL FILTER INCLUDING SOLDERLESS GROUND CLIP HAVING SURGE PROTECTION AND SHIELDING FEATURES

CROSS-REFERENCE TO RELATED APPLICATIONS

This application claims the benefit of U.S. Provisional Application Ser. No. 60/461,174 filed Apr. 8, 2003, the entirety of which is incorporated herein by reference.

FIELD OF THE INVENTION

The present invention relates to electronic signal filters used in the CATV industry. More particularly, the present invention relates to an electronic signal filter including a ground clip that provides magnetic isolation shielding, surge protection, and the required electrical grounding for a circuit board positioned within a filter housing in a solderless manner.

BACKGROUND OF THE INVENTION

In some CATV electronic signal filter applications, magnetic isolation shielding is required between filter sections within a filter cavity of the filter housing in order for the filter to function properly. Isolation shields are typically positioned to extend above and/or below the surface of a circuit board on which discrete electronic components comprising the filter sections are positioned. This is shown, for example, in U.S. patent application Ser. No. 10/301,014 (now U.S. Pat. No. 6,59,927), which is owned by the assignee of the present invention and the entirety of which is incorporated herein by reference. Although the ’014 Application provides magnetic isolation shields that can be assembled to a circuit board using automated Z-axis manufacturing techniques, it is still necessary to connect the shield to the circuit board and the filter housing to achieve grounding contact therebetween after the circuit board and shield sub-assembly is inserted into the filter housing.

That is, in order to provide the required grounding contact between the circuit board, the magnetic isolations shields, and the housing, it is necessary to solder the shields to the circuit board and the filter housing during assembly of the filter. The post-insertion soldering step involved with connecting the shields to the filter housing, however, increases the manufacturing costs of the electronic signal filter. Moreover, achieving the required ground connection in this manner can be quite difficult, since the shields are positioned inside the filter housing before being soldered.

Since such manual soldering steps are costly, with respect to both manufacturing speed and expense, it would be desirable to provide an electronic signal filter that includes magnetic isolation shields that do not require an additional manual soldering step to provide a secure grounding connection between the shield members and the filter housing.

Protection from excessive current surges through CATV filters is also an important consideration. As described in U.S. Pat. No. 6,560,087, which is owned by the assignee of the present invention and the entirety of which is incorporated herein by reference, a spark gap can be provided by properly spacing a portion of a magnetic isolation shield from a plated via or conductive trace formed on a surface of a circuit board. The spark gap effectively shunts the excess current to ground and protects downstream electronic components from the otherwise harmful current surge.

In the devices of the ’087 patent, however, the magnetic isolation shield into which the spark gap is incorporated must also be connected to ground in order to properly perform the desired current shunting function. That is, the shield must be soldered to the filter housing to provide the required ground connection. Again, this requires a manual soldering step performed after the circuit board has been inserted into the filter cavity within the filter housing.

Thus, it would be desirable to provide an electronic signal filter having a component that provides the desired surge protection without requiring additional manual post-insertion soldering steps in order to provide grounding contact.

U.S. Pat. No. 6,429,754, and U.S. patent application Ser. Nos. 10/187,455 (now U.S. Pat. No. 6,674,342 and 10/329,055 (now U.S. Publication No. 2003-0151470), which are owned by the assignee of the present invention and the entireties of which are incorporated herein by reference, disclose ground post members that facilitate automated Z-axis manufacturing and solderless ground connections between opposed filter housing members of a split housing filter and a circuit board interposed therebetween within the filter cavity. While the ground posts of the ’754 patent, the ’455 Application and ’055 Application afford solderless ground connections and eliminate some soldering steps in general, the use of such ground posts is not applicable in many filter applications, such as those that employ compact filter housings that are not split along the longitudinal axes. Thus, room for improvement remains.

Another drawback associated with conventional electronic signal filters is that multiple components are generally required in order to provide multiple features such as shielding, surge protection, and grounding. Using multiple individual precision components also drives up the production cost of the final product, due to the number of manufacturing sub-assembly steps required and complex manual soldering steps that must be performed after the sub-assemblies are positioned in the filter housings.

Accordingly, it would be desirable to provide an electronic signal filter whose component parts can be assembled into an electronic signal filter final product without any soldering steps performed after the circuit board is inserted into the filter housing. It would also be desirable to provide an electronic signal filter whose overall number of discrete sub-assembly components could be reduced. It would also be desirable to provide an electronic signal filter electronic signal filter including a single component that provides ground contact between the circuit board and the filter housing, that provides magnetic isolation shielding and that provides surge protection, all without any post-insertion soldering steps.

SUMMARY OF THE INVENTION

The present invention has been made in order to overcome the drawbacks associated with the prior art. That is, it is an object of the present invention to provide an electronic signal filter including a single component that provides grounding contact between the circuit board and the filter housing, that provides magnetic isolation shielding and that provides surge protection, all without any post-insertion soldering steps.

According to one embodiment of the present invention, an electronic signal filter is provided, including a first filter housing member extending along a longitudinal direction from a first end thereof to an opposed second end thereof, a second filter housing member extending along the longitudinal direction from a first end thereof, which engages at least the second end of the first filter housing member, to an opposed second end thereof, and a filter cavity defined by the first and second filter housing members. A circuit board is positioned within the filter cavity. The circuit board extends from a first end thereof toward an opposed second end thereof in the longitudinal direction and has a first surface, an opposed second surface, a first edge and an opposed second edge. The circuit board also includes a slot that opens in the first edge of the circuit board, and the slot extends in a substantially lateral direction toward a terminal end thereof proximate the second edge of the circuit board.

A ground clip for providing a ground connection between the circuit board and the first and the second filter housing members is also included. The ground clip includes a main portion having at least a first portion positioned within the slot of the circuit board and a slot-retaining portion extending from a first end thereof proximate a first end of the main portion toward a distal end thereof in the lateral direction and being positioned within the slot of the circuit board. At least one grounding arm is also included, extending from a first end thereof proximate the main portion toward an opposed distal end thereof, such that the grounding arm is in grounding contact with an inner surface of the second filter housing member. The ground clip also includes at least one grounding leg extending from a first end thereof proximate a second end of the main portion to an opposed distal end thereof in the longitudinal direction. The grounding leg extends a sufficient distance in the longitudinal direction such that at least a portion of the grounding leg is positioned in an interface between the first and the second filter housing members to achieve a secure ground contact between the circuit board, the first fitter housing member, and the second filter housing member in a solderless manner.

The main portion of the ground clip further includes a second portion extending from the first surface of the circuit board in a third direction substantially perpendicular to the circuit board and a third portion extending from the second surface of the circuit board in the third direction. Preferably, the second and third portions of the main portion of the ground clip are of sufficient size to provide shielding between filter components provided on at least one of the first and the second surfaces of the circuit board.

A hairpin bend is provided between the first end of the main portion of the ground clip and the first end of the slot-retaining portion, such that the distal end of the slot-retaining portion extends toward the opening of the slot substantially in the lateral direction. Preferably, the distal end of the slot-retaining portion includes at least a first positioning member that contacts the first surface of the circuit board to prevent movement of the distal end of the slot-retaining portion in the third direction. It is more preferable to further include a second positioning member that contacts the second surface of the circuit board to prevent movement of the distal end of the slot-retaining portion in the third direction. Preferably, the hairpin bend is sufficiently resilient such that at least the distal end of the slot-retaining portion exerts a force in the longitudinal direction away from the first portion of the main portion.

A notch is provided in the hairpin bend that has a first portion dimensioned to provide a spark gap with respect to a circuit pattern provided on the circuit board. Preferably, the notch extends into the first end of the main portion and the first end of the slot-retaining portion. Further, the notch preferably includes a second portion adjacent the first portion. The second portion is preferably dimensioned to engage the circuit board and prevent movement of the grounding clip in the third direction.

It is also preferred that the grounding arm includes a first grounding arm extending in the third direction, substantially perpendicular to the surfaces of the circuit board, from the second portion of the main portion and a second grounding arm extending in the third direction from the third portion of the main portion. Preferably, the first grounding arm is in grounding contact with a portion of the inner surface of the second filter housing member opposing the first surface of the circuit board, and the second grounding arm is in grounding contact with a portion of the inner surface of the second filter housing member opposing the second surface of the circuit board.

It is particularly preferred that a distance between the distal ends of the first and the second grounding arms is greater than an inner diameter of the second filter housing member, and that the first and the second grounding arms are resilient. In that manner, at least a portion of the respective distal ends contacts the inner surface of the second filter housing and is deviated from the third direction toward the first end of the second filter housing in the longitudinal direction when the circuit board is inserted the first end of the second filter housing member.

It is also preferred that the grounding leg further includes a raised boss member opposing the first edge of the circuit board for limiting movement of the grounding leg toward the first edge of the circuit board.

It is also preferred that the second end of the first filter housing member is inserted into and received within the first end of the second filter housing member. Preferably, the grounding leg extends a sufficient distance in the longitudinal direction such that at least a portion of the grounding leg extends between an outer surface of the first filter housing member proximate the second end thereof and the inner surface of the second filter housing member proximate the first end thereof.

The surface mounted electronic components are soldered to a circuit board array, for example, using efficient (e.g., automated) and inexpensive reflow soldering operations. After the circuit boards are singulated from the array, a ground clip is inserted into the slot of a singulated circuit board and soldered thereto, forming a pre-insertion sub-assembly. The present invention, however, allows for the omission of all subsequent soldering steps which are performed after the circuit board sub-assembly is inserted into and properly positioned within the filter housing. As a result, the overall cost of manufacturing the filter can be reduced.

Moreover, the ground clip of the present invention can be attached to a circuit board using an automated insertion step (e.g. with Z-axis robotics if the circuit board is rotated) and is securely retained in the slot of the circuit board even before being soldered. Although a soldering step is required to permanently connect the ground clip to the circuit board, this step can be performed either manually or robotically before the sub-assembly is inserted into the filter housing. Thus, an expensive and complicated post-insertion soldering step can be avoided. Further, the mechanical interference provided by the grounding leg of the ground clip ensures a secure ground connection between the circuit board and the filter housing members without soldering the ground clip to any portions of the filter housing members. This also eliminates an expensive and complicated post-insertion soldering step, which reduces the productions costs, as well.

The spark gap protection afforded by the first portion of the notch formed in the hairpin bend of the ground clip is obtained without adding any additional structural elements to the filter circuit board sub-assembly, which would require separate assembly and/or soldering steps to be properly assembled therewith. The number of discrete components is reduced, which enables a correlating cost reduction.

Further still, for electronic signal filters that require magnetic isolation between filter sections, the second and third portions of the main portion of the ground clip provide sufficient shielding, as described above. Since the grounding arms extending from these shielding sections also provide secure grounding contact with the inner surface of the second filter housing member without solder, it is not necessary or desired to solder the second and third portions of the main portion of the ground clip (i.e., the shielding sections) to the filter housing member after the circuit board has been positioned within the filter cavity.

Thus, the present invention achieves the above-mentioned objectives by providing an electronic signal filter that includes a single component (i.e., a ground clip) that provides surge protection, shielding functions, and a secure ground connection between the circuit board and the filter housings without any subsequent (i.e., post-insertion) soldering steps.

According to another embodiment of the present invention, an electronic signal filter is provided, including a first filter housing member extending along a longitudinal direction from a first end thereof to an opposed second end thereof, a second filter housing member extending along the longitudinal direction from a first end thereof, which engages at least the second end of the first filter housing member, to an opposed second end thereof, and a filter cavity defined by the first and second filter housing members. A circuit board is positioned within the filter cavity, and extends from a first end thereof toward an opposed second end thereof in the longitudinal direction. The circuit board has a first surface, an opposed second surface, a first edge and an opposed second edge, and a slot that opens in the first edge of the circuit board. The slot extends in a substantially lateral direction toward a terminal end thereof proximate the second edge of the circuit board.

A ground clip for providing a ground connection between the circuit board and the first and second filter housing members is also included. The ground clip includes a main portion having a first portion positioned within the slot of the circuit board and a slot-retaining portion extending from a first end thereof proximate a first end of the main portion toward a distal end thereof in the lateral direction and being positioned within the slot of the circuit board. At least one grounding leg is also included, extending from a first end thereof proximate a second end of the main portion to an opposed distal end thereof in the longitudinal direction. The grounding leg extends a sufficient distance in the longitudinal direction such that at least a portion of the grounding leg is positioned in an interface between the first and the second filter housing members to achieve a secure ground contact between the circuit board, the first filter housing member, and the second filter housing member in a solderless manner.

The ground clip also includes a first grounding arm extending in a third direction substantially perpendicular to the surface of the circuit board from a second portion of the main portion, and a second grounding arm extending in the third direction from a third portion of the main portion. The first grounding arm is in grounding contact with a portion of an inner surface of the second filter housing member opposing the first surface of the circuit board, and the second grounding arm is in grounding contact with a portion of the inner surface of the second filter housing member opposing the second surface of the circuit board. The distance between the distal ends of the first and the second grounding arms is greater than an inner diameter of the second filter housing member, and the first and the second grounding arms are resilient such that at least a portion of the respective distal ends contacts the inner surface of the second filter housing and is deviated from the third direction toward the first end of the second filter housing in the longitudinal direction when the circuit board is inserted into the first end of the second filter housing member.

According to yet another embodiment of the present invention, an electronic signal filter is provided, including a first filter housing member extending along a longitudinal direction from a first end thereof to an opposed second end thereof, a second filter housing member extending along the longitudinal direction from a first end thereof, which engages at least the second end of the first filter housing member, to an opposed second end thereof, and a filter cavity defined by the first and second filter housing members. A circuit board is positioned within the filter cavity, and extends from a first end toward thereof an opposed second end thereof in the longitudinal direction. The circuit board has a first surface, an opposed second surface, a first edge and an opposed second edge, and a slot that opens in the first edge of the circuit board, the slot extending in a substantially lateral direction toward a terminal end thereof proximate the second edge of the circuit board.

A ground clip for providing a ground connection between the circuit board and the first and the second filter housing members is also included. The ground clip includes a main portion having at least a first portion positioned within the slot of the circuit board, a slot-retaining portion extending from a first end thereof proximate a first end of the main portion toward a distal end thereof in the lateral direction and being positioned within the slot of the circuit board, and a hairpin bend between the first end of the main portion and the first end of the slot-retaining portion, such that the distal end of the slot-retaining portion extends toward the opening of the slot substantially in the lateral direction. A notch is formed in the hairpin bend. The notch includes a first portion dimensioned to provide a spark gap with respect to a circuit pattern provided on the circuit board.

At least one grounding leg is also included. The grounding leg extends from a first end thereof proximate a second end of the main portion to an opposed distal end thereof in the longitudinal direction. The grounding leg extends a sufficient distance in the longitudinal direction such that at least a portion of the grounding leg is positioned in an interface between the first and the second filter housing members to achieve a secure ground contact between the circuit board, the first filter housing member, and the second filter housing member in a solderless manner.

According to yet another embodiment of the present invention, an electronic signal filter is provided. The electronic signal filter includes a first filter housing member extending along a longitudinal direction from a first end thereof to an opposed second end thereof, a second filter housing member extending along the longitudinal direction from a first end thereof, which engages at least the second end of the first filter housing member, to an opposed second end thereof and a filter cavity defined by the first and second filter housing members. A circuit board is positioned within the filter cavity, extending from a first end thereof toward an opposed second end thereof in the longitudinal direction and having a first surface, an opposed second surface, a first edge and an opposed second edge, and a notch having a first end that opens in the first edge of the circuit board. The notch extends a distance in a substantially lateral direction toward the second edge of the circuit board to a terminal end thereof. The electronic signal filter also includes a ground clip for providing a ground connection between the circuit board and the first and the second filter housing members.

The ground clip comprises a main portion extending from a first end to an opposed second end thereof in the lateral direction and has at least a first portion proximate the second end thereof positioned within the notch of the circuit board. The first portion of the main portion extends a distance beyond one of the first and the second surfaces of the circuit board in a third direction substantially perpendicular to the circuit board. The ground clip also includes at least one grounding arm extending from a first end thereof proximate the main portion toward an opposed distal end thereof. The grounding arm is in grounding contact with at least an inner surface of the second filter housing member. The ground clip further includes at least one grounding leg extending from a first end thereof proximate a second end of the main portion to an opposed distal end thereof in the longitudinal direction. The grounding leg extends a sufficient distance in the longitudinal direction such that at least a portion of the grounding leg is in grounding contact with at least the inner surface of the second filter housing member to achieve a secure ground contact between the circuit board, the first filter housing member, and the second filter housing member in a solderless manner.

The grounding leg preferably includes a raised boss member opposing the first edge of the circuit board for limiting movement of the grounding leg toward the first edge of the circuit board. It is also preferred that the distance between the first end of the notch and the terminal end of the notch is in a range of 0.025 to 0.065 inches.

It is also preferred that the main portion of the ground clip further comprises a second portion extending from the other one of the first and second surfaces of the circuit board in the third direction. Preferably, the second portion of the main portion of the ground clip is of sufficient size to provide shielding between filter components provided on the other one of the first and the second surfaces of the circuit board.

It is also preferred that the at least one grounding arm comprises a first grounding arm and a second grounding arm. Preferably, the first grounding arm extends from one portion of the second portion of the main portion of the ground clip and the second grounding arm extends from another portion of the second portion of the main portion of the ground clip. The distance between the first ends and the distal ends of each of the first and second grounding arms is preferably greater than the inner radius of the second filter housing member.

According to one aspect of the present invention, the first grounding arm extends from a lower edge portion of the second portion of the main portion of the ground clip substantially in the third direction and wherein the second grounding arm extends from another lower edge of the second portion of the main portion of the ground clip substantially in the third direction.

It is also preferred that the main portion of the ground clip further comprises a notch formed on a portion thereof proximate the first end thereof. Preferably, the notch of the main portion of the ground clip is dimensioned to provide a spark gap with respect to a circuit pattern printed on the other one of the first and second surfaces of the circuit board.

According to one aspect of the present invention, the first portion of the main portion of the ground clip further comprises a projection extending a distance from an edge portion thereof in the lateral direction beyond the terminal end of the notch. At least a portion of the projection is adapted to contact the one of the first and the second surfaces of the circuit board proximate the terminal end of the notch to provide a mechanical ground connection between the circuit board and the ground clip in a solderless manner.

According to another aspect of the present invention, the circuit board further comprises an opening formed in a substantially central location laterally positioned between the first edge and the second edge of the circuit board. The opening preferably has a lateral axis that is substantially coaxial with a lateral central axis of the notch, and is preferably one of an elongate notch and a substantially circular through-hole. In this case, it is preferred that the ground clip further comprises a third grounding arm extending from a first end thereof proximate yet another location on the main portion of the ground clip toward a distal end thereof in the third direction.

According to one embodiment of the present invention, the first grounding arm extends from one portion of the second portion of the main portion of the ground clip and the second grounding arm extends from another portion of the second portion of the main portion of the ground clip. The third grounding arm extends from an upper edge of the second portion of the main portion of the ground clip, passes through the opening in the circuit board and extends a distance beyond the one of the first and the second surfaces of the circuit board.

According to one aspect of the present invention, the third grounding arm further comprises a hairpin bend positioned between the one of the first and second surfaces of the circuit board and the distal end of the third grounding arm. The third grounding arm is bent at the hairpin bend to extend back toward the opening of the circuit board such that the distal end of the third grounding arm is proximate the one of the first and the second surfaces of the circuit board.

According to another aspect of the present invention, the third grounding arm further comprises a substantially perpendicular bend positioned between the one of the first and the second surfaces of the circuit board and the distal end of the third grounding arm. The third grounding arm is bent at the substantially perpendicular bend to extend in the longitudinal direction such that the distal end of the third grounding arm is proximate the one of the first and second surfaces of the circuit board.

It is also preferred that the circuit board further comprises a conductive pad positioned proximate the opening on at least one of the first and second surfaces of the circuit board, and that the distal end of the third grounding arm contacts the conductive pad.

According to another aspect of the present invention, the first grounding arm extends from an upper edge of the second portion of the main portion in the third direction and through the opening, and the second grounding arm extends from a lower edge of the second portion of the main portion in the third direction. The first grounding arm is in grounding contact with a portion of the inner surface of the second filter housing member opposing the one of the first and second surfaces of the circuit board, and the second grounding arm is in grounding contact with a portion of the inner surface of the second filter housing member opposing the other one of the first and second surfaces of the circuit board. In this case, it is preferred that the distance between the distal end of the first grounding arm and the distal end of the second grounding arm is greater than an inner diameter of the second filter housing member.

According to another aspect of the present invention, the first grounding arm extends from a lateral edge of the second portion of the main portion proximate the first end of the main portion in the longitudinal direction, and the second grounding arm extends from a lower portion of the second portion of the main portion in the third direction. The first and the second grounding arms are in grounding contact with respective portions of the inner surface of the second filter housing member opposing the other one of the first and the second surfaces of the circuit board, and the distance between the first end and the distal end of each of the first and the second grounding arms is greater than the inner radius of the second filter housing member.

According to yet another aspect of the present invention, the circuit board further comprises another notch having a first end that opens in the second edge of the circuit board. The other notch extends a distance in the lateral direction toward the first edge of the circuit board to terminal end thereof, and substantially opposes the notch in the lateral direction. In cases wherein the other notch is also provided, it is preferable that the main portion of the ground clip further comprises a third portion proximate the first end thereof, positioned within the other notch of the circuit board and extending a distance beyond the one of the first and second surfaces of the circuit board in the third direction. The first grounding arm preferably extends from the third portion of the main portion of the ground clip in the longitudinal direction, and the second grounding arm preferably extends from a lower edge of the second portion of the main portion in the third direction. In that manner, the first and the second grounding arms are in grounding contact with respective portions of the inner surface of the second filter housing member opposing the other one of the first and second surfaces of the circuit board. It is also preferred that the distance between the first and the distal ends of each of the first and the second grounding arms is greater than the inner radius of the second filter housing member.

BRIEF DESCRIPTION OF THE DRAWINGS

For a better understanding of the nature and objects of the invention, reference should be made to the following detailed description of a preferred mode of practicing the invention, read in connection with the accompanying drawings, in which.

DETAILED DESCRIPTION OF THE INVENTION

Figure 1:
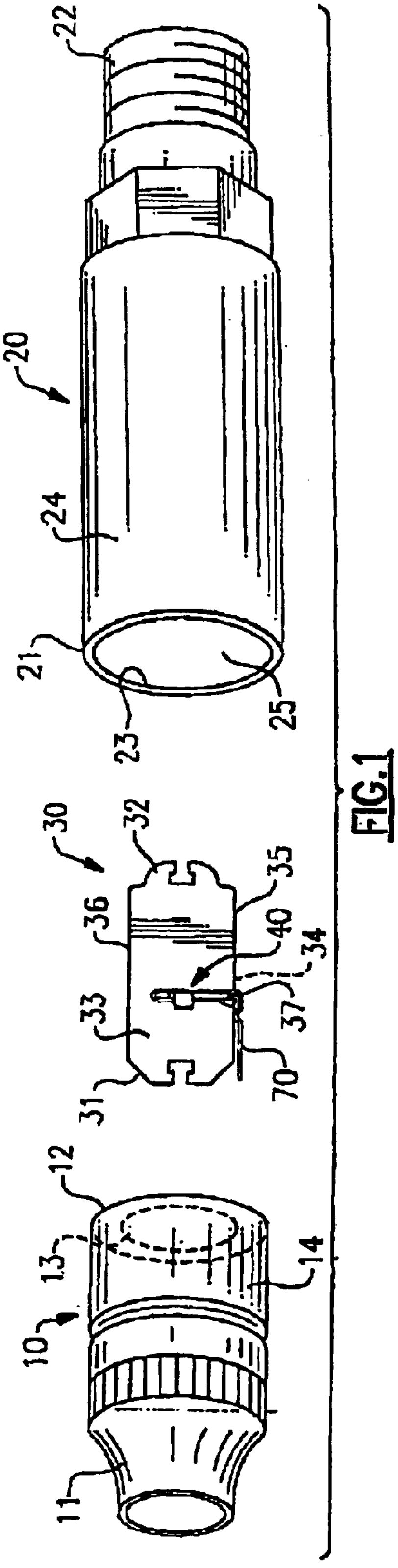
FIG. 1 is an exploded assembly view of an electronic signal filter according to an embodiment of the present invention.

FIG. 1 is an exploded assembly view of an electronic signal filter 1 according to an embodiment of the present invention. A first filter housing member 10 (e.g., end cap) extends from a first end 11 to an opposed second end 12 thereof in a longitudinal direction, and includes an inner surface 13 and an outer surface 14. A second filter housing member 20 extends from a first end 21 to an opposed second end 22 thereof in the longitudinal direction, and includes an inner surface 23, an outer surface 24 and a filter cavity 25.

FIG. 1 also shows a circuit board 30 interposed between the first and second filter housing members 10, 20. The circuit board 30 extends from a first end 31 to an opposed second end 32 thereof in the longitudinal direction, and from a first edge 35 to an opposed second edge 36 thereof in a lateral direction, which is substantially perpendicular to the longitudinal direction, as shown. The circuit board 30 also includes a first (e.g., upper) surface 33 and an opposed second (e.g., lower) surface 34. Printed circuit patterns (see, for example, FIG. 2) can be provided on either or both of the surfaces 33, 34 of the circuit board 30.

A ground clip 40 is positioned within a slot 37 formed in the circuit board 30. The ground clip 40 includes, among other features described in more detail herein below with respect to FIGS. 2–5, a grounding leg 70 that extends along the first edge 35 of the circuit board 30 toward the first end 31 of the circuit board 30.

The ground clip 40 is positioned within the slot 37 of the singulated circuit board 30 and electrically connected to the circuit board by soldering before the circuit board sub-assembly is inserted into the filter cavity 25. For example, the ground clip 40 can be soldered to the first surface 33 of the circuit board 30 on either edge of the slot 37 proximate the first edge 35 before the circuit board sub-assembly is inserted into the filter cavity 25. It is also preferable to apply a small amount of solder to the ground clip 40, for example, forming a solder bridge spanning slot 37. The second end 32 of the circuit board 30 is introduced into the filter cavity 25 in the longitudinal direction from the first end 21 of the second filter housing member 20, such that the first end 31 of the circuit board 30 is arranged proximate the first end 21 of the second filter housing member and the second end 32 is arranged proximate the second end 22 of the second filter housing member.

Figure 2:
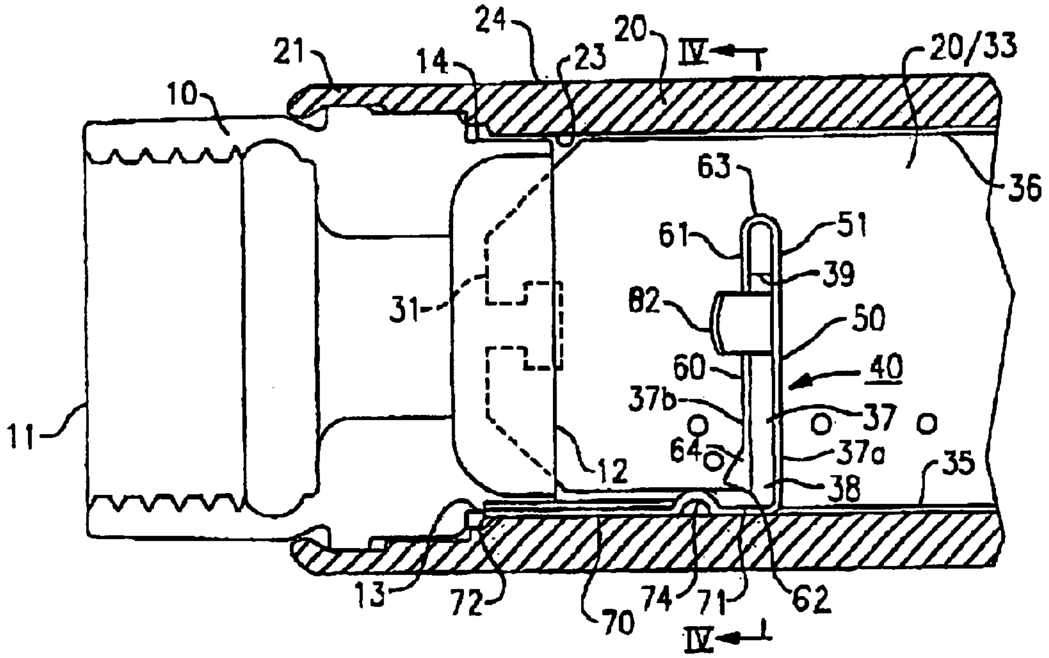
FIG. 2 is a partial sectional top view of an electronic signal filter according to one embodiment of the present invention.

FIG. 2 is a partial cut-away top view of a portion of the electronic signal filter 1 in the assembled state. At least a portion of the second end 12 of the first filter housing member 10 has a shape (i.e., portions of varying diametrical dimensions) that is complimentary to the shape of the inner surface 23 of the first end 21 of the second filter housing member 20 in order to facilitate a mating assembly between the first and second filter housing members 10, 20. The second end 12 of the first filter housing member 10 is inserted into the first end 21 of the second filter housing member 20 in the longitudinal direction (i.e., the X-axis direction) such that the outer surface 14 of the second end 12 of the first filter housing member 10 opposes the inner surface 23 of the first end 21 of the second filter housing member 20. The first filter housing member 10 is inserted into the first end 21 of the second filter housing member 20 after the circuit board 30 is positioned within the filter cavity 25 as described above.

FIG. 2 also shows that the slot 37 of the circuit board 30 extends in the lateral direction (i.e., the Y-axis direction) from an opening 38 formed in the first edge 35 of the circuit board 30 toward an opposed terminal end 39 of slot 37 proximate the second edge 36 of the circuit board 30. The opening 38 of the slot 37 also extends from a first inner sidewall 37*a* to an opposed inner sidewall 37*b* over a distance in the longitudinal direction defining the width of the slot 37. The ground clip 40 is positioned between the sidewalls 37*a*, 37*b* of the slot 37.

Figure 4:
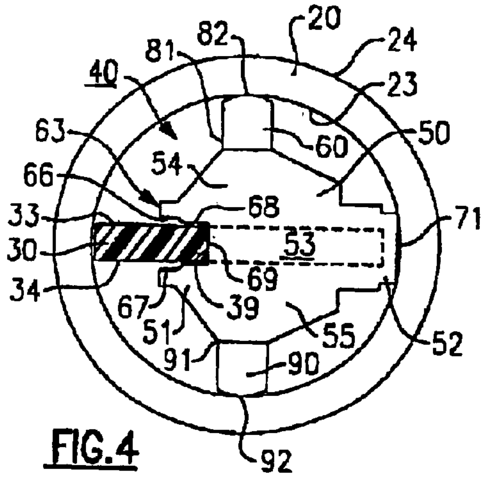
FIG. 4 is a cross-sectional end view of the electronic signal filter taken through line IV—IV of FIG. 2.

The cross-sectional view illustrated in FIG. 4, taken through the line IV—IV of FIG. 2, shows that the ground clip 40 includes a main portion 50 extending from a first end 51 thereof to an opposed second end 52 thereof in the lateral direction (substantially parallel to the direction of the slot 37). The main portion 50 is essentially divided into three sections (areas) having different positions with respect to the circuit board 30. That is, a first section 53 of the main portion 50 resides between the opposed inner sidewalls 37*a*, 37*b* of the slot 37 and includes that part of the main portion 50 that traverses the thickness of the circuit board 30 in the third direction (i.e., the Z-axis direction; substantially perpendicular to both the longitudinal and lateral directions).

A second section 54 of the main portion 50 extends from the first section 53 above the first surface 33 of the circuit board 30 in the third direction. A third section 55 of the main portion 50 extends from the first section 53 below the second surface 34 of the circuit board 30 in the third direction. The second 54 and third 55 sections are of sufficient size to provide shielding (i.e., magnetic shielding) between filter sections provided on one or both of the first and second surfaces 33, 34 of the circuit board 30.

As shown in FIG. 2, the ground clip 40 includes a slot-retaining portion 60 that opposes first section 53 of main portion 50, and is positioned within slot 37 abutting inner sidewall 37*b* of slot 37. A hairpin bend portion 63 is interposed between the first end 51 of the main portion 50 and the first end 61 of the slot-retaining portion 60 proximate the terminal end 39 of the slot 37. As shown in FIG. 4, the hairpin bend portion 63 extends beyond the terminal end 39 of the slot 37 above and below the surfaces 33, 34 of the circuit board 30. FIG. 2 shows that the slot-retaining portion 60 extends from the hairpin bend 63 in the lateral direction toward a distal end 62 thereof proximate the opening 38 of the slot 37.

The hairpin bend 63 is sufficiently resilient so that the slot-retaining portion 60 exerts a spring-like retaining force in the longitudinal direction toward the opposed inner sidewall 37*b* of the slot 37 and away from the first section 53 of the main portion 50, which exerts a similar force against the inner sidewall 37*a* of the slot 37. The angle at which the hairpin bend 63 is formed is not critical so long as the slot-retaining portion 60 and the first section 53 exert sufficient retaining force against the inner sidewalls 37*a*, 37*b* of the slot 37. Preferably, at least the hairpin bend 63 and slot-retaining portion 60 are sufficiently resilient to compress to some degree in the longitudinal direction toward the main portion 50 as the ground clip 40 is inserted into the slot 37 in the lateral direction from the slot opening 38.

Figure 3:
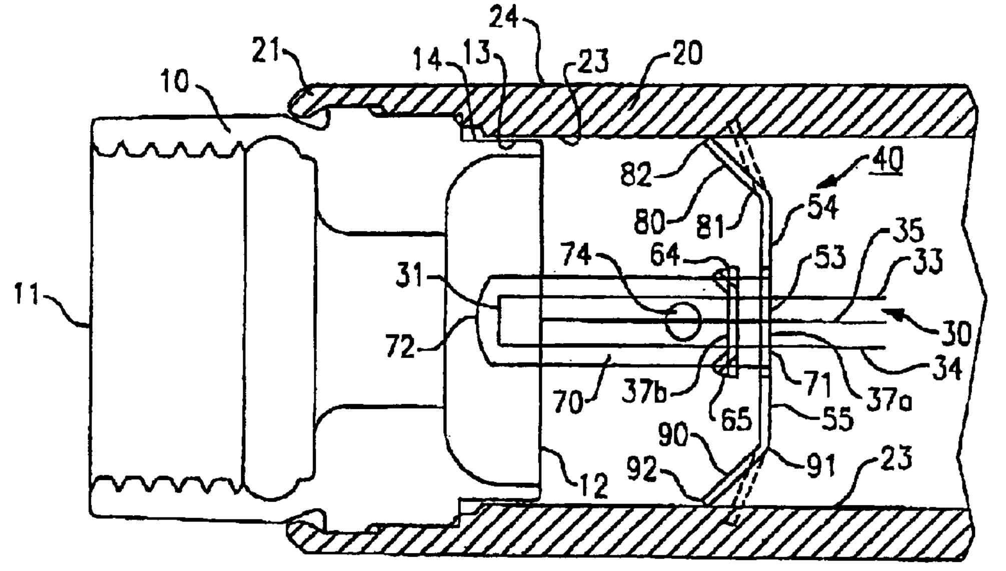
FIG. 3 is a partial sectional side view of the electronic signal filter of FIG. 2.

Positioning members 64 and 65 (best seen in FIGS. 2 and 3) are formed at the distal end 62 of the slot-retaining portion 60. Each positioning member 64, 65 is bent at an angle in the longitudinal direction, such that positioning member 64 contacts the first surface 33 of the circuit board 30, as shown in FIG. 3. Similarly, positioning member 65 is positioned to contact the second surface 34 of the circuit board 30. By sandwiching the circuit board therebetween, the positioning members 64, 65 add stability for the ground clip 40 until it can be soldered to the circuit board 30.

The hairpin bend 63 also includes a notch 66. As shown in FIG. 4, the notch 66 is substantially symmetrical in both the longitudinal and third directions, and is essentially folded in half about an imaginary line substantially corresponding to a center line of the hairpin bend 63 in the third direction.

Part of the notch 66 is positioned above the first surface 33 of the circuit board 30, and part of the notch 66 is positioned below the second surface 34 of the circuit board 30. The end 69 of the notch 66 is essentially a lateral stop, and prevents movement of the ground clip 40 in the slot 37 in the lateral direction toward the second edge 36 of the circuit board 30 (i.e., toward the terminal end 39 of the slot 37). As shown in FIG. 4, for example, the end 69 of the notch 66 preferably meets (abuts) the terminal end 39 of the slot 37 in the lateral direction. This also adds stability to the ground clip 40 within the slot 37 before soldering is performed.

The notch 66 includes a first portion 67 spaced from the end 69 by a second portion 68. The first portion 67 is also spaced from the first and second surfaces 33, 34 of the circuit board 30. Although it is not specifically shown in the drawings, a portion of a printed circuit provided on either or both the first and second surfaces 33, 34 of the circuit board 30 (see for example FIG. 2) is substantially aligned with (i.e., positioned beneath) the first portion 67 of the notch 66 in the third direction.

As shown in FIG. 4, the space between the surfaces 33, 34 of the circuit board 30 and the first portion 67 of the notch 66 is dimensioned to provide spark gap protection in the event of a power surge when the electronic signal filter is being tested or used. That is, the distance between the surfaces 33, 34 of the circuit board 30 and a respective first portion 67 of the notch 66 is sufficient to shunt a surging current to ground via the ground clip 40 itself, which is in grounding contact with the first and second filter housing members 10, 20, which are in turn in electrical contact with a grounded portion of a coaxial cable.

The second portion 68 of the notch 66 is dimensioned to prevent movement of the ground clip 40 with respect to the surfaces 33, 34 of the circuit board 30 in the third direction. As shown in FIG. 4, the second portion 68 is interposed between the notch end part 69 and the notch first portion 67 in the lateral direction, and essentially rests (is seated) on a portion of each surface 33, 34 of the circuit board 30 beyond the terminal end 39 of the slot 37. This also adds pre-soldering mechanical stability to the ground clip 40 within the slot 37.

FIGS. 2–4 show that the ground clip 40 also includes a first grounding arm 80 extending from a first end 81 thereof, which is integral with the second section 54 of the main portion 50, to an opposed distal end 82 thereof in the third direction. A second grounding arm 90 is also included, extending from a first end 91 thereof, which is integral with the third section 55 of the main portion 50, to an opposed distal end 92 thereof in the third direction.

The first grounding arm 80 extends above the first surface 33 of the circuit board 30 in the third direction toward a portion of the upper inner surface 23 of the second filter housing member 20. As shown in FIGS. 3 and 4, the distal end 82 contacts the upper inner surface 23 of the second filter housing member 20 and is slightly deviated (the dotted lines in FIG. 3 show its original shape/position) from the third direction toward the first end 21 of the second filter housing member 20 in the longitudinal direction when the circuit board 30 (having ground clip 40 attached thereto) is inserted into the filter cavity 25 upon assembly. This provides secure grounding contact between the circuit board 30 and the second filter housing member 20 through the first grounding arm 80.

Similarly, the second grounding arm 90 extends below the second surface 34 of the circuit board 30 in the third direction toward a portion of the lower inner surface 23 of the second filter housing member 20. As shown in FIGS. 3 and 4, the distal end 92 contacts the lower inner surface 23 of the second filter housing member 20 and is slightly deviated from the third direction toward the first end 21 of the second filter housing member 20 in the longitudinal direction when the circuit board 30 (having ground clip 40 attached thereto) is inserted into the filter cavity 25 upon assembly. This provides secure grounding contact between the circuit board 30 and the second filter housing member 20 through the second grounding arm 90.

FIG. 3 shows that the distance between the distal ends 82, 92 of grounding arms 80, 90 is greater than the inner diameter of second filter housing member 20, to ensure that the distal ends 82, 92 are deviated in the longitudinal direction. This provides pressing contact between the distal ends 82, 92 and the inner surface 23 of the housing 20 to ensure good grounding.

Grounding contact is further provided by grounding leg 70, which extends from a first end 71 thereof, which is integral with the second end 52 of the main portion 50, as shown in FIGS. 2 and 3. The angle between the main portion 50 and the grounding leg 70 is sufficient to ensure that a portion of the grounding leg 70 is present in the space between the first edge 35 of the circuit board 30 and the inner surface 23 of the second filter housing member 20. From the first end 71, the grounding leg 70 extends in the longitudinal direction toward the first end 21 of the second filter housing member 20.

As shown in FIG. 2, a portion of the grounding leg 70 proximate the first end 71 opposes the opening 38 of the slot 37 in the lateral direction, such that the opening 38 is closed-off by the grounding leg 70. Further, the grounding leg 70 (extending toward the first end 21 of the second filter housing member 20) is interposed between the inner surface 23 of the second filter housing member 20 and the first edge 35 of the circuit board 30 over the distance between the first end 31 of the circuit board 30 and the slot 37.

A raised boss member 74 protrudes from the grounding leg 70 toward the first edge 35 of the circuit board 30 in the lateral direction. As shown in FIG. 2, the raised boss member 74 essentially spaces the grounding leg 70 a predetermined distance from the first edge 35 of the circuit board 30. The raised boss member 74 also ensures that the grounding leg 70 is positioned in contact with and extends along the inner surface 23 of the second filter housing member 20. This is important in order for the grounding leg 70 to be properly positioned to provide the desired mechanical interference (and thus, electrical grounding contact) between the mated filter housing members 10, 20. In that manner, the grounding leg 70 is prevented from catching on the second end 12 of the first filter housing member 10 as is inserted into the first end 21 of the second filter housing member 20 and being lifted out of the desired interposition location when the filter is assembled.

The distal end 72 of the grounding leg 70 extends toward the first end 21 of the second filter housing member 20 a sufficient distance such that a portion of the distal end 72 of the grounding leg 70 extends between the outer surface 14 of the second end 12 of the first filter housing member 10 and the inner surface 23 of the first end 21 of the second filter housing member 20 (see FIG. 1). The mechanical interference provided by the interposition of the grounding leg 70 in this manner ensures sufficient electrical grounding contact between the circuit board 30 and the filter housing members 10, 20. The outer surfaces 14, 24 of the filter housing members 10, 20 are also in grounding contact with a portion of the CATV coaxial cable and/or a device to which the electronic signal filter is connected. This allows for the electronic signal filter of the present invention to be used in applications that involve higher frequencies and a greater degree of electrical grounding.

Figure 5:
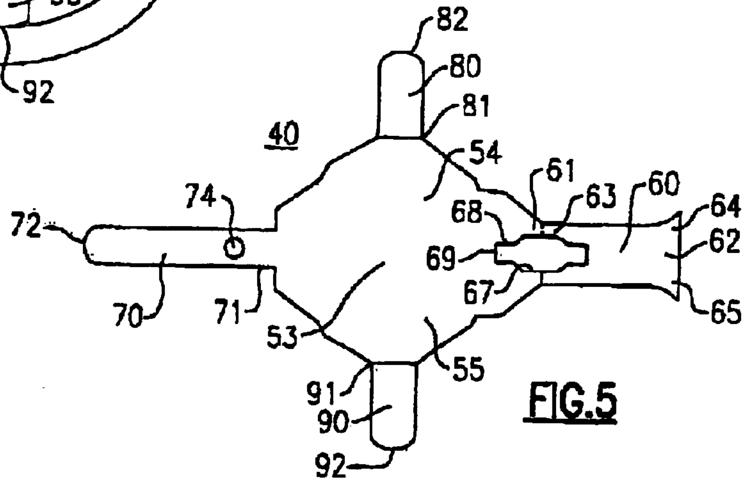
FIG. 5 is a plan view of an as-stamped ground clip according to an embodiment of the present invention.

FIG. 5 shows the grounding clip in an as-stamped flat state, as it would appear when initially stamped from a piece of flat stock metal. The reference numerals shown in FIG. 5 have been discussed above.

Figure 6:
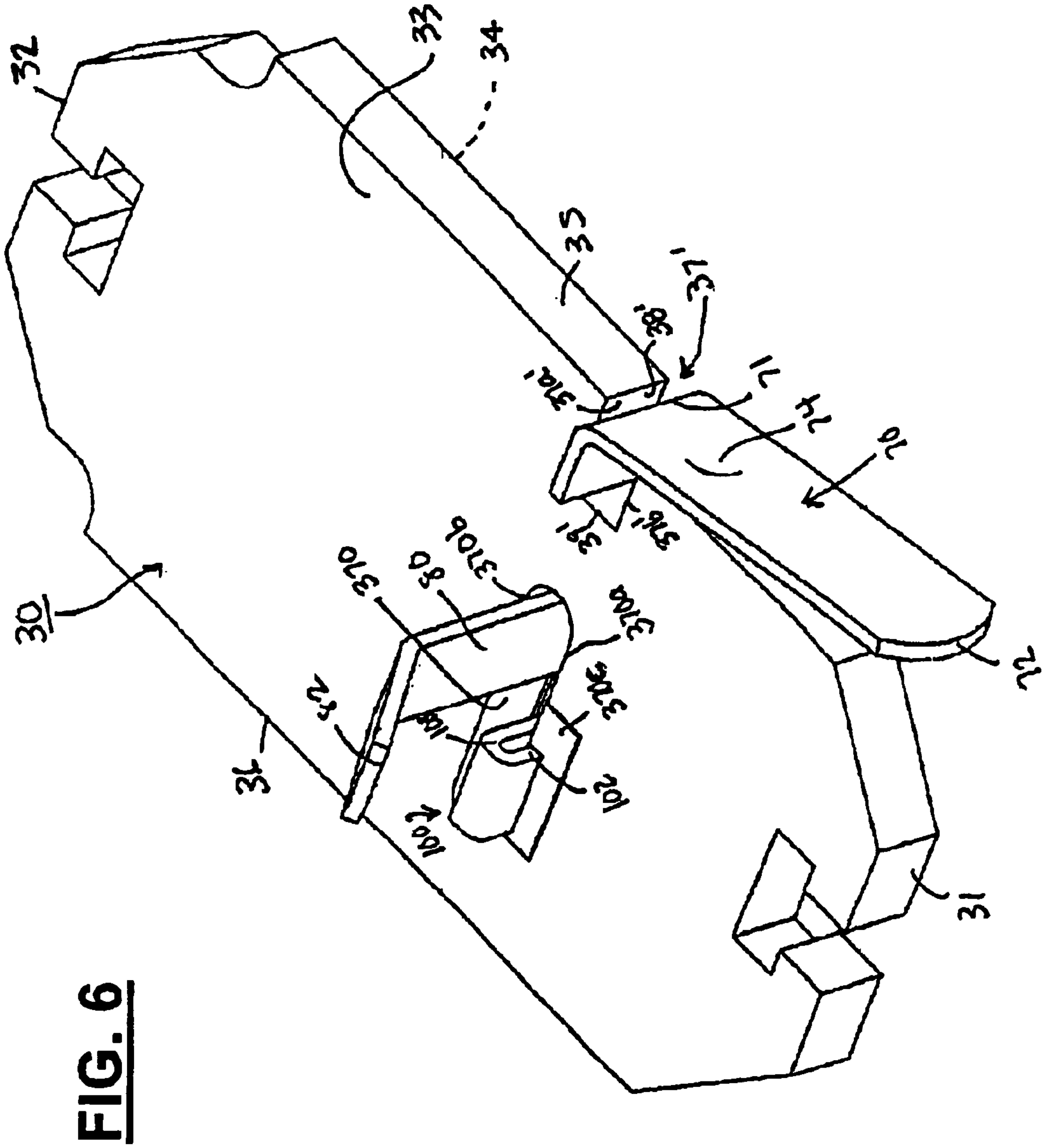
FIG. 6 is a perspective view of a circuit board and ground clip assembly according to one embodiment of the present invention.
Figure 7:
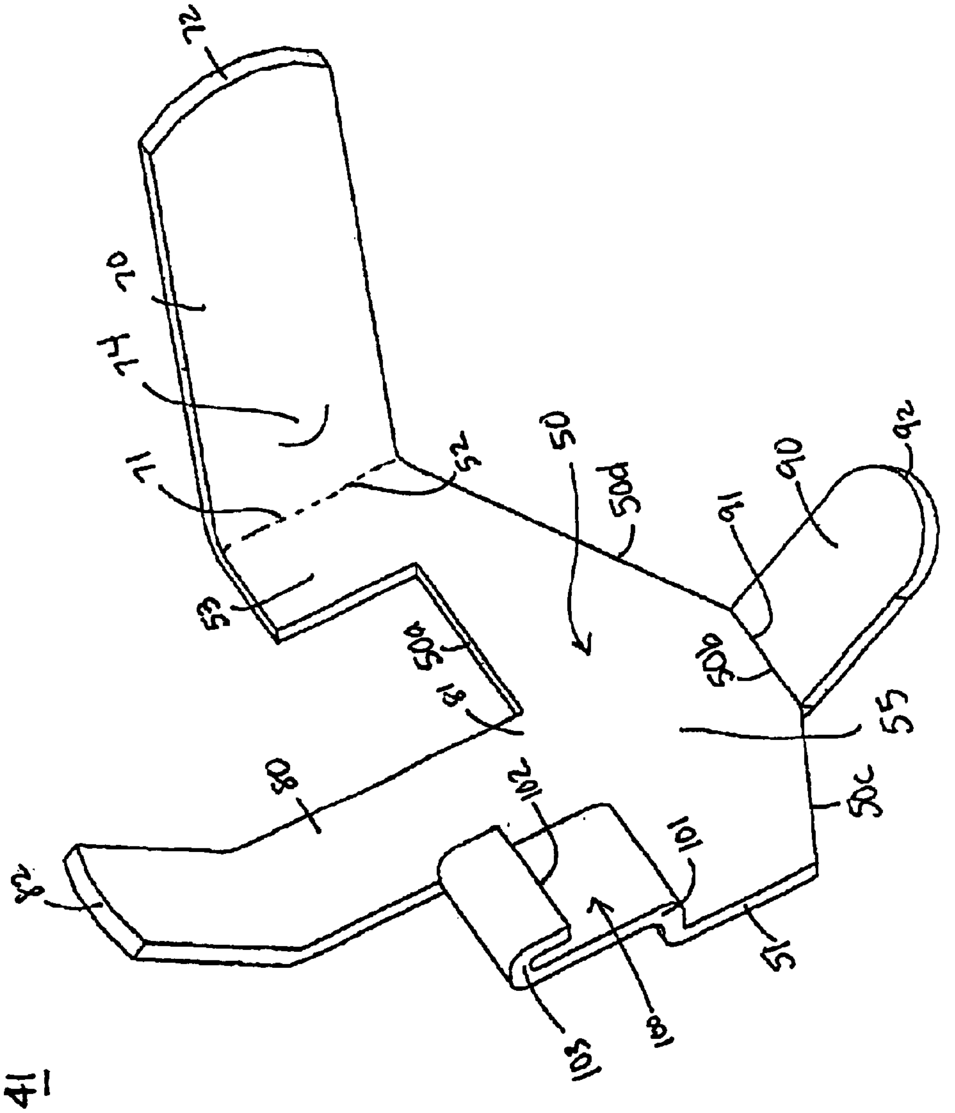
FIG. 7 is a perspective view shown in the ground clip shown in FIG. 6.

FIG. 6 is a perspective view of a circuit board and ground clip assembly according to one embodiment of the present invention, and FIG. 7 is a perspective view of the ground clip 41 shown in FIG. 6. The ground clip 41 is positioned within a notch 37' formed in the circuit board 30 as shown in FIG. 6.

The circuit board 30 extends from a first end 31 to an opposed second end 32 in the longitudinal direction. The circuit board 30 also extends from a first edge 35 to an opposed second edge 36 in the lateral direction. The notch 37' extends in the lateral direction (i.e., the Y-axis direction) from an opening 38' formed in the first edge 35 of the circuit board 30 toward the second edge 36 of the circuit board 30 to the terminal end 39', defining a length dimension of the notch 37'. Preferably, the distance between the first end 38' and the terminal end 39' of the notch 37' is in a range of 0.025 to 0.065 inches. The opening 38' of the notch 37' also extends from a first inner sidewall **37*a*' to an opposed inner sidewall 37*b*', over a distance in the longitudinal direction defining the width of the notch 37'. Preferably, the distance between the opposing inner sidewalls 37*a*' and 37*b*' is greater than the angled corner formed at the second end 52 of the main portion of the ground clip 41 and the first end 71 of the grounding leg 70, described in more detail below, so that the first end 71 does not protrude beyond the first edge 35 of the circuit board 30 to prevent deformation of the grounding leg 70 when the assembly is inserted into the second filter housing member. That is, in order for the ground leg 70 to maintain the desired mechanical tension toward the inner surface 23 of the filter housing member 20, it is important to prevent inward bending of that grounding leg to preserve the mechanical ground connection between the grounding leg 70 and the second filter housing member 20**.

The circuit board 30 also includes an opening 370 passing from the first surface 33 to the second surface 34 in the third direction, and has a length dimension extending from a first end to an opposed second end in the lateral direction. The opening 370 also has a width dimension extending from a first side **370*a* to an opposed second side 370*b* in the longitudinal direction of the circuit board 30. As shown, the width dimension of the opening 370 is significantly less than the length dimension thereof, and the opening 370 has a central (lateral) axis (i.e., extending along the length direction) that is substantially coaxial with the central (lateral) axis of the notch 37' in the length direction. The opening 370 can be formed by a series of peck drilled holes, for example, and can be through-plated with a conductive material or left in an un-plated state. It is also preferred to provide a conductive pad 370***c* on a portion of the first surface 33 of the circuit board 30 as shown in FIG. 6, and as described in more detail below.

A portion of the ground clip 41 is positioned within the notch 37' of the singulated circuit board 30 and electrically connected to the circuit board by soldering, for example, before the circuit board sub-assembly is inserted into the filter cavity 25, as described above with reference to FIG. 2. As shown in FIG. 6, a first portion 53 of the main portion 50 (see FIG. 7) of the ground clip 41 is positioned between the sidewalls 37*a*', 37*b*' of the notch 37'.

That is, as shown in FIG. 7, the ground clip 41 includes a main portion 50 extending from a first end 51 thereof (proximate the second edge 36 of the circuit board 30 as shown in FIG. 6) to an opposed second end 52 thereof (proximate the first edge 35 of the circuit board 30) in the lateral direction (substantially parallel to the direction of the notch 37' as shown in FIG. 6). The main portion 50 is essentially divided into two sections having different positions with respect to the circuit board 30; a first section 53 of the main portion 50 resides between the opposed inner sidewalls 37*a*', 37*b*' of the notch 37' and includes that part of the main portion 50 that traverses the thickness of the circuit board 30 in the third direction (i.e., the Z-axis direction, substantially perpendicular to both the longitudinal and lateral directions) and extends a distance beyond the first surface 33 of the circuit board 30 in the third direction; and a second section 55 of the main portion 50 extends from an upper edge 50*a* positioned proximate the second surface 34 of the circuit board 30 in the third direction to an opposed lower edge that is defined by a plurality of contiguous angled edges 50*b*, 50*c* and 50*d*. The second section 55 is of sufficient size to provide shielding (i.e., magnetic shielding) between filter sections provided on one or both of the first and second surfaces 33, 34 of the circuit board 30.

The ground clip 41 of FIGS. 6 and 7 also includes a first grounding arm 80 extending from a first end 81 thereof, which is integral with one portion of the second section 55 of the main portion 50, to an opposed distal end 82 thereof in the third direction. As shown in FIG. 7, the first grounding arm 80 extends in the third direction from a portion of the upper edge 50*a* of the second section 55 of the main portion 50. A second grounding arm 90 is also included, extending from a first end 91 thereof, which is integral with another portion of the second section 55 of the main portion 50, to an opposed distal end 92 thereof in the third direction. As shown in FIG. 7, the first end 91 of the second grounding arm 90 is integral with a lower edge 50*b* of the second section 55 of the first portion 50 of the ground clip 41. As shown, the portion of the second section 55 of the main portion 50 from which the first grounding arm 80 extends (50*a*) is substantially directly opposed (e.g., diametrically opposed) to the other portion of the second section 55 of the main portion 50 from which the second grounding arm 90 extends (50*b*).

The first grounding arm 80 of the ground clip 41 extends through the opening 370 in the circuit board 30 (as shown in FIG. 6) and above the first surface 33 of the circuit board 30 in the third direction toward a portion of the upper inner surface 23 of the second filter housing member 20. As described above in connection with FIGS. 3 and 4, at least a portion of the distal end 82 contacts the upper inner surface 23 of the second filter housing member 20 and is slightly deviated (the dotted lines in FIG. 3 show its original shape/position) from the third direction toward the first end 21 of the second filter housing member 20 in the longitudinal direction when the circuit board 30 (having ground clip 41 attached thereto) is inserted into the filter cavity 25 upon assembly. This provides secure grounding contact between the circuit board 30 and the second filter housing member 20 through the first grounding arm 80.

Similarly, the second grounding arm 90 of the ground clip 41 extends below the second surface 34 of the circuit board 30 in the third direction toward a portion of the lower inner surface 23 of the second filter housing member) 20. As described above in connection with FIGS. 3 and 4, at least a portion of the distal end 92 contacts the lower inner surface 23 of the second filter housing member 20 and is slightly deviated from the third direction toward the first end 21 of the second filter housing member 20 in the longitudinal direction when the circuit board 30 (having ground clip 40 attached thereto) is inserted into the filter cavity 25 upon assembly. This provides secure grounding contact between the circuit board 30 and the second filter housing member 20 through the second grounding arm 90.

The distance between the distal ends 82, 92 of grounding arms 80, 90 is greater than the inner diameter of second filter housing member 20, to ensure that the distal ends 82, 92 are deviated in the longitudinal direction. This provides pressing contact between the distal ends 82, 92 and the inner surface 23 of the housing 20 to ensure good electrical grounding.

Grounding contact is further provided by grounding leg 70, which extends from a first end 71 thereof, which is integral with the second end 52 of the main portion 50, as shown in FIGS. 6 and 7. The angle between the second end 52 of the main portion 50 and the grounding leg 70 is sufficient to ensure that a portion of the grounding leg 70 is present in the space between the first edge 35 of the circuit board 30 and the inner surface 23 of the second filter housing member 20. From the first end 71, the grounding leg 70 extends in the longitudinal direction toward the first end 21 of the second filter housing member 20.

As shown in FIG. 6, a portion of the grounding leg 70 proximate the first end 71 opposes the opening 38' of the notch 37' in the lateral direction, such that the opening 38' is closed-off by the grounding leg 70. Further, the grounding leg 70 (extending toward the first end 21 of the second filter housing member 20) is interposed between the inner surface 23 of the second filter housing member 20 and the first edge 35 of the circuit board 30 over the distance between the first end 31 of the circuit board 30 and the notch 37'.

A raised boss member 74 protrudes from the grounding leg 70 toward the first edge 35 of the circuit board 30 in the lateral direction. As shown in FIG. 6, the raised boss member 74 essentially spaces the grounding leg 70 a predetermined distance from the first edge 35 of the circuit board 30. The raised boss member 74 also ensures that the grounding leg 70 is positioned in contact with and extends along the inner surface 23 of the second filter housing member 20. This is important in order for the grounding leg 70 to be properly positioned to provide the desired mechanical interference (and thus, electrical grounding contact) between the mated filter housing members 10, 20. In that manner, the grounding leg 70 is prevented from catching on the second end 12 of the first filter housing member 10 as is inserted into the first end 21 of the second filter housing member 20 and being lifted out of the desired interposition location when the filter is assembled.

The distal end 72 of the grounding leg 70 extends toward the first end 21 of the second filter housing member 20.

According to another embodiment of the present invention, the grounding leg 70 extends a sufficient distance such that a portion of the distal end 72 extends between the outer surface 14 of the second end 12 of the first filter housing member 10 and the inner surface 23 of the first end 21 of the second filter housing member 20 (e.g., see FIG. 1). The mechanical interference provided by the interposition of the grounding leg 70 in this manner ensures sufficient electrical grounding contact between the circuit board 30 and the filter housing members 10, 20.

In addition to the first and second grounding arms 80, 90 and the grounding leg 70, a third grounding arm 100 is provided to directly ground the ground clip 41 and the circuit board 30, as shown in FIGS. 6 and 7. The third grounding arm 100 extends through the opening 370 in the third direction from a first end 101 thereof, which is integral with the upper edge 50*a* of the second section 55 of the main portion 50, to an opposed distal end 102 thereof. The third grounding arm 100 also includes a hairpin bend portion 103 located between the terminal end 102 thereof and the first surface 33 of the circuit board 30. The hairpin bend 103 effectively redirects the terminal end 102 of the third grounding arm 100 to extend back toward the first surface 33 of the circuit board 30 in the third direction such that the terminal end 102 of the third grounding arm 100 contacts the upper surface 33 of the circuit board 30, and preferably contacts conductive pad 370*c* proximate the opening 370, as shown.

As shown in FIG. 7, the first end 101 of the third grounding arm 100 can include a bent portion such that the main plane of the third grounding arm 100, which is parallel to the Z-axis direction, is also parallel planar with respect to the main plane of the first grounding arm 80. That is, the main plane of the third grounding arm 100 is spaced a distance in the X-axis direction (longitudinal direction) from the main plane of the first grounding arm 80 that corresponds to the longitudinal length of the bent portion at 101. Preferably, the longitudinal length of the bent portion at 101 is greater than the longitudinal width of the opening 370. In that manner, when the ground clip 41 is assembled onto the circuit board 30, the main plane of the third grounding arm 100 facing the first end 31 of the circuit board 30 contacts a first inner side wall 370*a* of the opening 370 and the main plane of the first grounding arm 80 facing the second end 32 of the circuit board 30 contacts a second inner side wall 370*b* of the opening 370. In addition to providing mechanical grounding in the case where the opening 370 is through plated, this structure also serves as a self-fixturing feature to securely hold the ground clip 41 in the fixed relationship with respect to the circuit board 30 by virtue of the spring tension between the first and third grounding arms 80, 100 within the opening 370.

In the case where the opening 370 is not through-plated with a conductive material, the terminal end 102 of the third grounding arm can be soldered to the conductive pad 370*c* to provide the desired ground connection between the ground clip 41 and the circuit board 30, as described above. This single solder joint is preferable to providing multiple solder joints, as in the prior art. If the opening 370 is through-plated, however, the solder can be introduced into a portion of the opening 370 to form the single solder joint that provides the ground connection between the ground clip 41 and the circuit board 30.

Although the ground clip 41 shown in FIGS. 6 and 7 provides magnetic isolation shielding on only one side (i.e., the second surface 34) of the circuit board 30, Applicants have discovered that the multiple grounding contact points (e.g., distal ends 82 and 92 of the grounding arms 80 and 90 and the portion of the grounding leg 70 that contact the inner surface 23 of the second filter housing member 20) provide sufficient grounding and that the ground clip 41 performs well even without an opposed second shielding portion.

Figure 8:
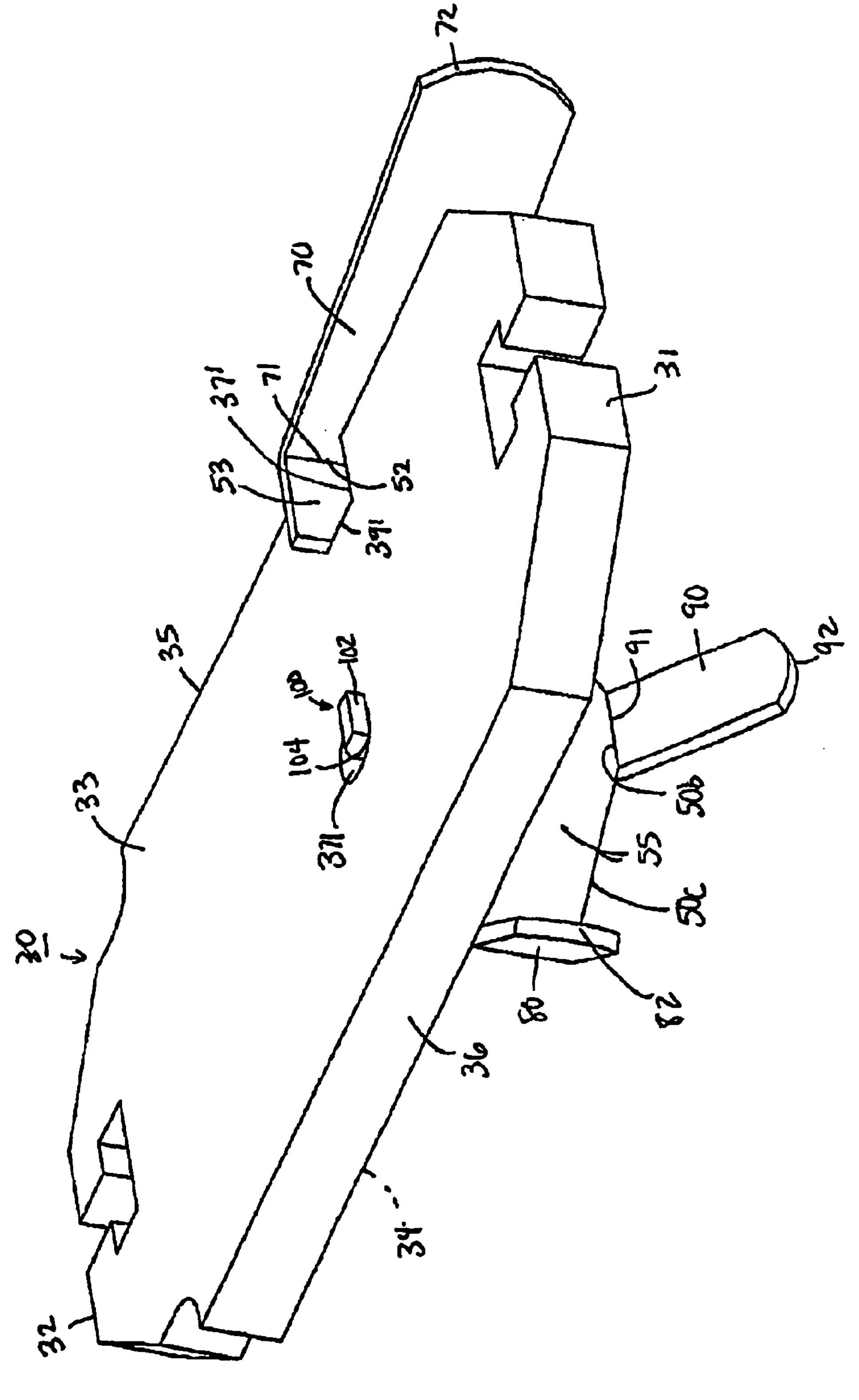
FIG. 8 is a perspective view of a circuit board and ground clip assembly according to another embodiment of the present invention.
Figure 9:
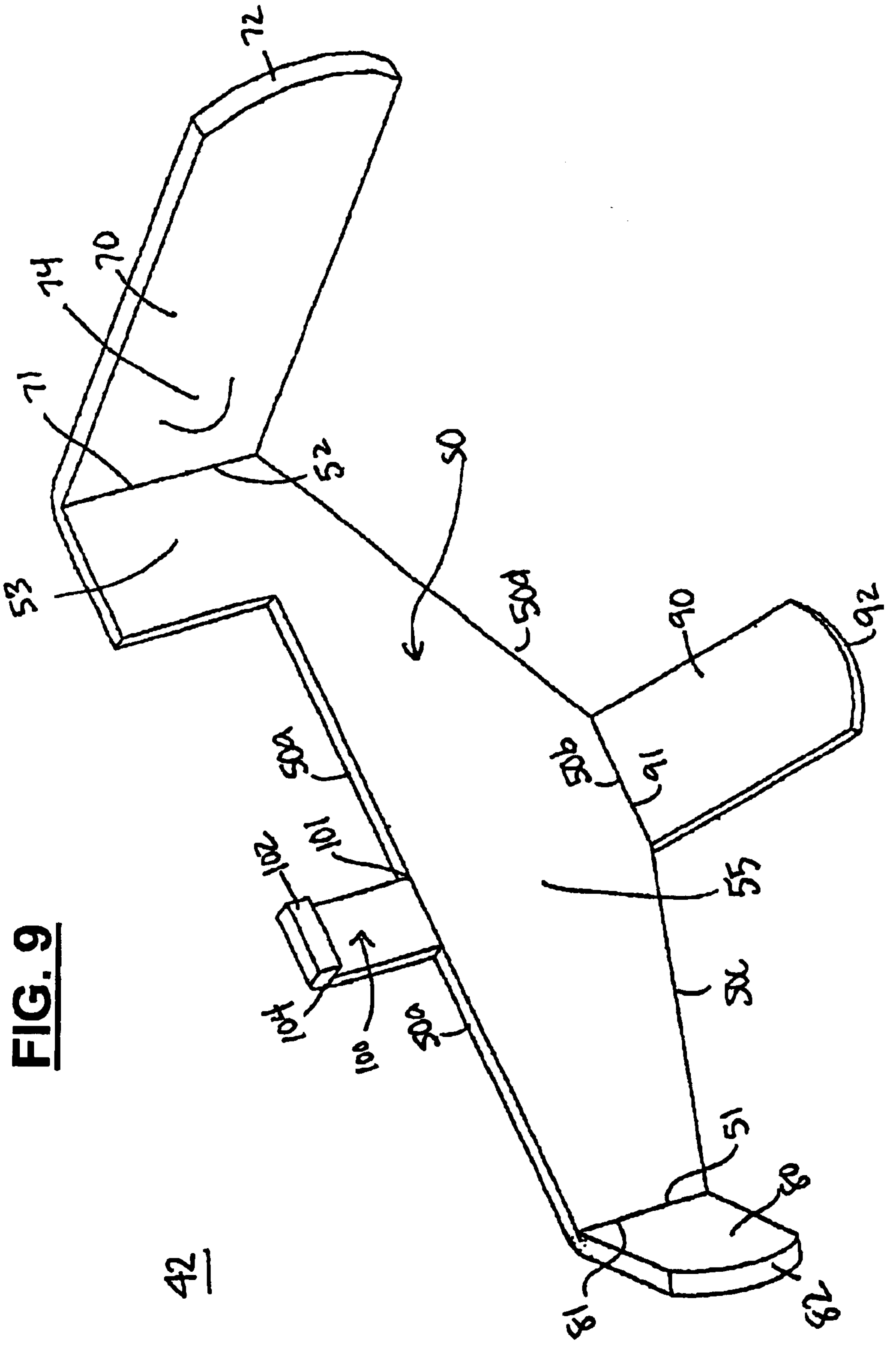
FIG. 9 is a perspective view of the ground clip shown in FIG. 8.

FIG. 8 is a perspective view of a circuit board and ground clip assembly according to another embodiment of the present invention, and FIG. 9 is a perspective view of the ground clip 42 shown in FIG. 8. The ground clip 42 is positioned within the notch 37' of the singulated circuit board 30 as described above with respect to FIGS. 6 and 7. The circuit board 30 of FIG. 8 also includes an opening in the shape of a substantially circular hole 371 formed in a substantially laterally central position and having a central axis that is substantially coaxial with the central lateral axis of the notch 37' in the length direction.

The opening 371 can be through-plated with a conductive material, or non-through plated, as described above with respect to opening 370 of FIG. 6. It should be noted, however, that the round opening 371 shown in FIG. 8, which can be formed by a single drilling operation, for example, is more easily through-plated than the elongate peck drilled-type opening 370 of FIG. 6. When the opening 371 is through-plated, there is no need to provide a conductive pad (such as pad 370*c* of FIG. 6) on the first surface 33 of the circuit board 30, and instead, the single solder joint between the circuit board 30 and the ground clip 42 is formed within the opening 371.

Like ground clip 41 of FIGS. 6 and 7, ground clip 42 shown in FIGS. 8 and 9 includes a main portion 50 having a first section 53 residing within the notch 37' and extending a distance above the first surface 33 of the circuit board 30, and a second section 55 extending a distance below the second surface 34 of the circuit board 30. Like features have been designated with like reference numbers, and repetitive descriptions will be omitted.

As shown, the first grounding arm 80 of the ground clip 42 of FIGS. 8 and 9 extends from a first end 81 thereof, which is integral with the first end 51 of the main portion 50 in the second section 55 thereof, to an opposed distal end 82 thereof in a laterally and longitudinally angular direction. The second grounding arm 90 extends from a first end 91 thereof, which is integral with the lower edge 50*b* of the second section 55 of the main portion 50, to an opposed distal end 92 thereof in the third direction.

At least a portion of the distal end 82 of the first grounding arm 80 contacts a portion of the lower inner surface 23 of the second filter housing member 20 in the longitudinal direction when the circuit board 30 (having ground clip 42 attached thereto) is inserted into the filter cavity 25 upon assembly. This provides secure grounding contact between the circuit board 30 and the second filter housing member 20 through the first grounding arm 80. The second grounding arm 90 of the ground clip 41 extends below the second surface 34 of the circuit board 30 in the third direction toward a portion of the lower inner surface 23 of the second filter housing member 20, as described above in connection with FIGS. 6 and 7, whereby at least a portion of the distal end 92 contacts the lower inner surface 23 of the second filter housing member 20 and provides secure grounding contact between the circuit board 30 and the second filter housing member 20 through the second grounding arm 90. The distance between the first ends 81, 91 and the respective distal ends 82, 92 of each grounding arm 80, 90 is greater than the inner radius of second filter housing member 20, to ensure that the distal ends 82, 92 provide pressing contact with the inner surface 23 of the housing 20 to ensure good grounding.

Grounding contact is further provided by grounding leg 70, which extends from a first end 71 thereof, which is integral with the second end 52 of the main portion 50, as shown in FIGS. 8 and 9, and is similar to the grounding leg 70 described above with respect to FIGS. 6 and 7. The grounding leg 70 of FIGS. 8 and 9 also includes a raised boss member 74 protruding from the grounding leg 70 toward the first edge 35 of the circuit board 30 in the lateral direction, as described above.

In addition to the first and second grounding arms 80, 90 and the grounding leg 70, a third grounding arm 100 is provided to directly ground the ground clip 42 and the circuit board 30, as shown in FIGS. 8 and 9. The third grounding arm 100 extends through the opening 371 in the third direction from a first end 101 thereof, which is integral with the upper edge 50*a* of the second section 55 of the main portion 50, to an opposed distal end 102 thereof. The third grounding arm 100 also includes a substantially perpendicular bend 104 located between the terminal end 102 thereof and the first surface 33 of the circuit board 30. The bend 104 effectively redirects the terminal end 102 of the third grounding arm 100 to extend in the longitudinal direction back toward the first end 31 of the circuit board 30 such that a portion of the terminal end 102 of the third grounding arm 100 contacts the first surface 33 of the circuit board proximate the opening 371. If the opening 371 is not through-plated, it would be desirable to provide a conductive pad proximate the opening 371 on at least the first surface 33 of the circuit board 30 and provide a single solder joint therewith.

Figure 10:
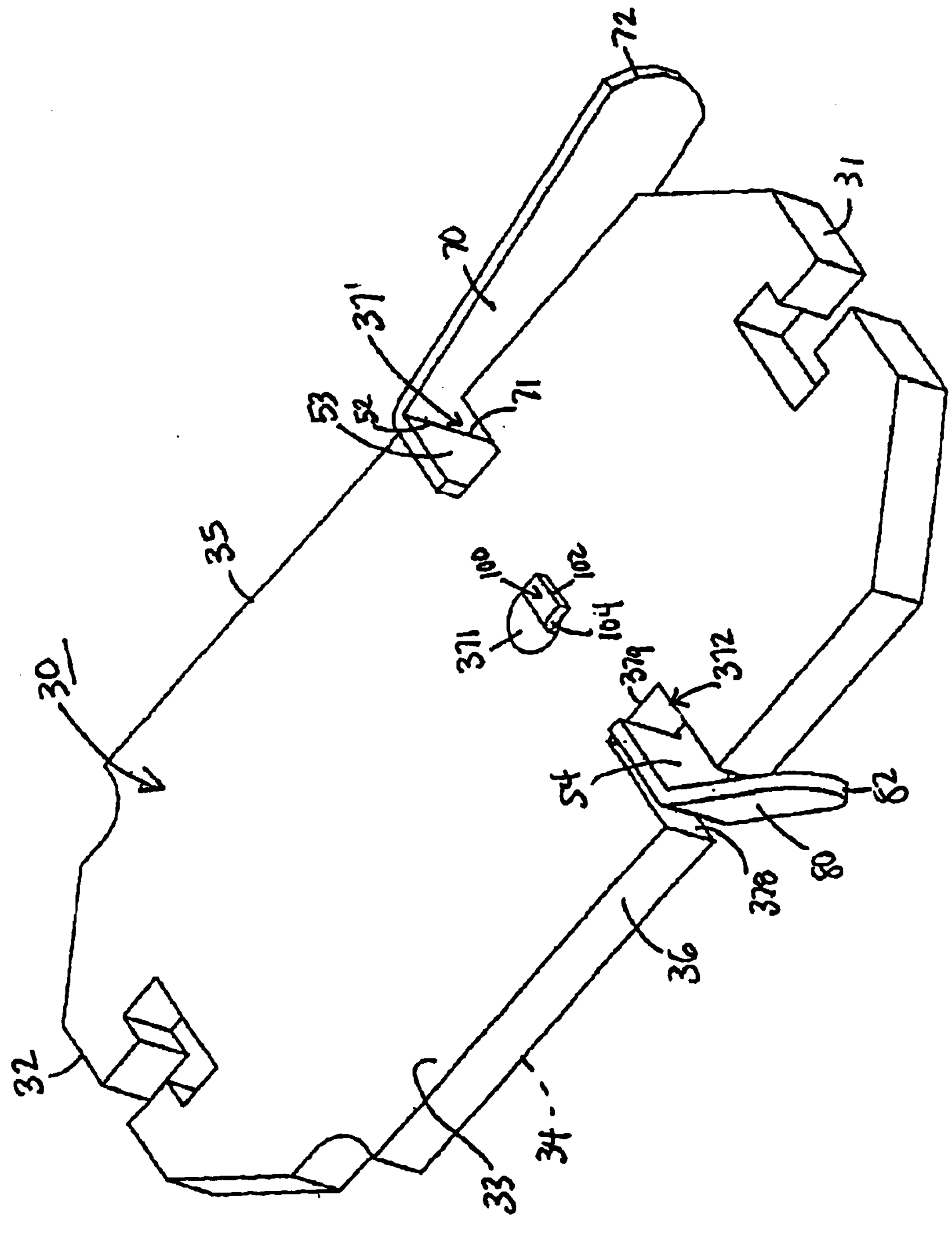
FIG. 10 is a perspective view of a circuit board and ground clip assembly according to another embodiment of the present invention.
Figure 11:
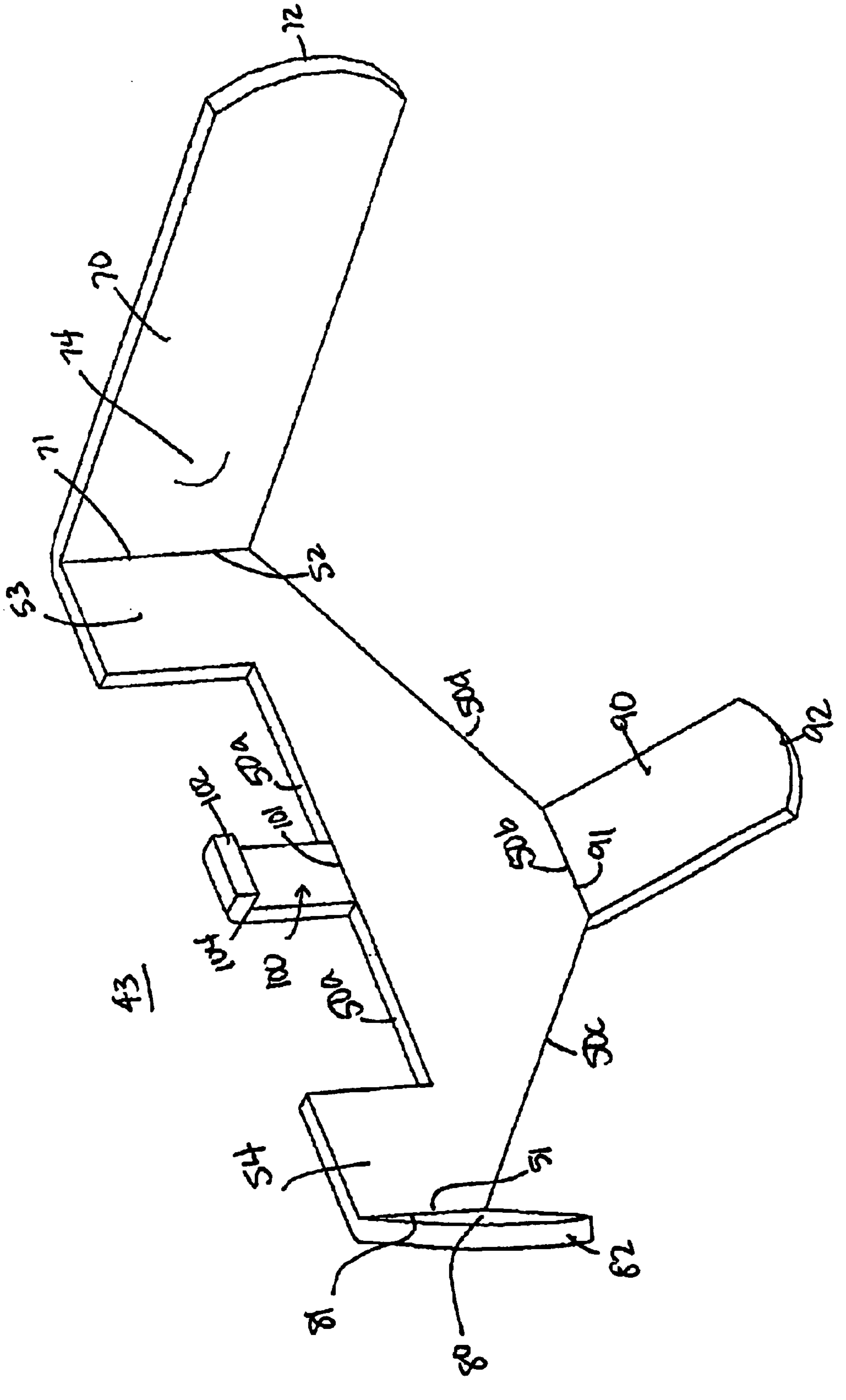
FIG. 11 is a perspective view of the ground clip shown in FIG. 10.

FIG. 10 is a perspective view of a circuit board and ground clip assembly according to another embodiment of the present invention and FIG. 11 is a perspective view of the ground clip 43 shown in FIG. 10. As shown, the circuit board 30 further comprises another notch 372 having a first end 378 that opens in the second edge 36 of the circuit board 30. The other notch 372 extends a distance in the lateral direction toward the first edge 35 of the circuit board 30 to the terminal end 379 thereof, and substantially opposes the notch 37' in the lateral direction.

In cases where the other notch 372 is provided, it is preferable that the main portion 50 of the ground clip 43 shown in FIG. 11 further comprises a third portion 54 proximate the first end 51 thereof, positioned within the other notch 372 of the circuit board 30 and extending a distance beyond the first surface 33 of the circuit board 30 in the third direction.

As shown in FIGS. 10 and 11, the first grounding 80 arm extends from the third portion 54 proximate the first end 51 of the main portion 50 of the ground clip 43 in the longitudinal direction, and the second grounding arm 90 extends from the lower edge 50*b* of the second portion 55 of the main portion 50 in the third direction. In that manner, at least a portion of each of the first and the second grounding arms 80, 90 are in grounding contact with respective portions of the inner surface 23 of the second filter housing member 20 opposing the second surface of the circuit board 30. It is preferred that the distance between the first ends 81, 91 and the distal ends 82, 92 of each of the first and the second grounding arms 80, 90 is greater than the inner radius of the second filter housing member 20.

Grounding contact between the ground clip 43 and the second filter housing member 20 is further provided by grounding leg 70, which extends from a first end 71 thereof, which is integral with the second end 52 of the main portion 50, as shown in FIGS. 10 and 11, and is similar to the grounding leg 70 described above with respect to FIGS. 6 and 7. The ground clip 43 shown in FIGS. 10 and 11 also includes a third grounding arm 100 for providing direct ground connection between the ground clip 43 and the circuit board 30, as described above in connection with FIGS. 8 and 9.

Figure 12:
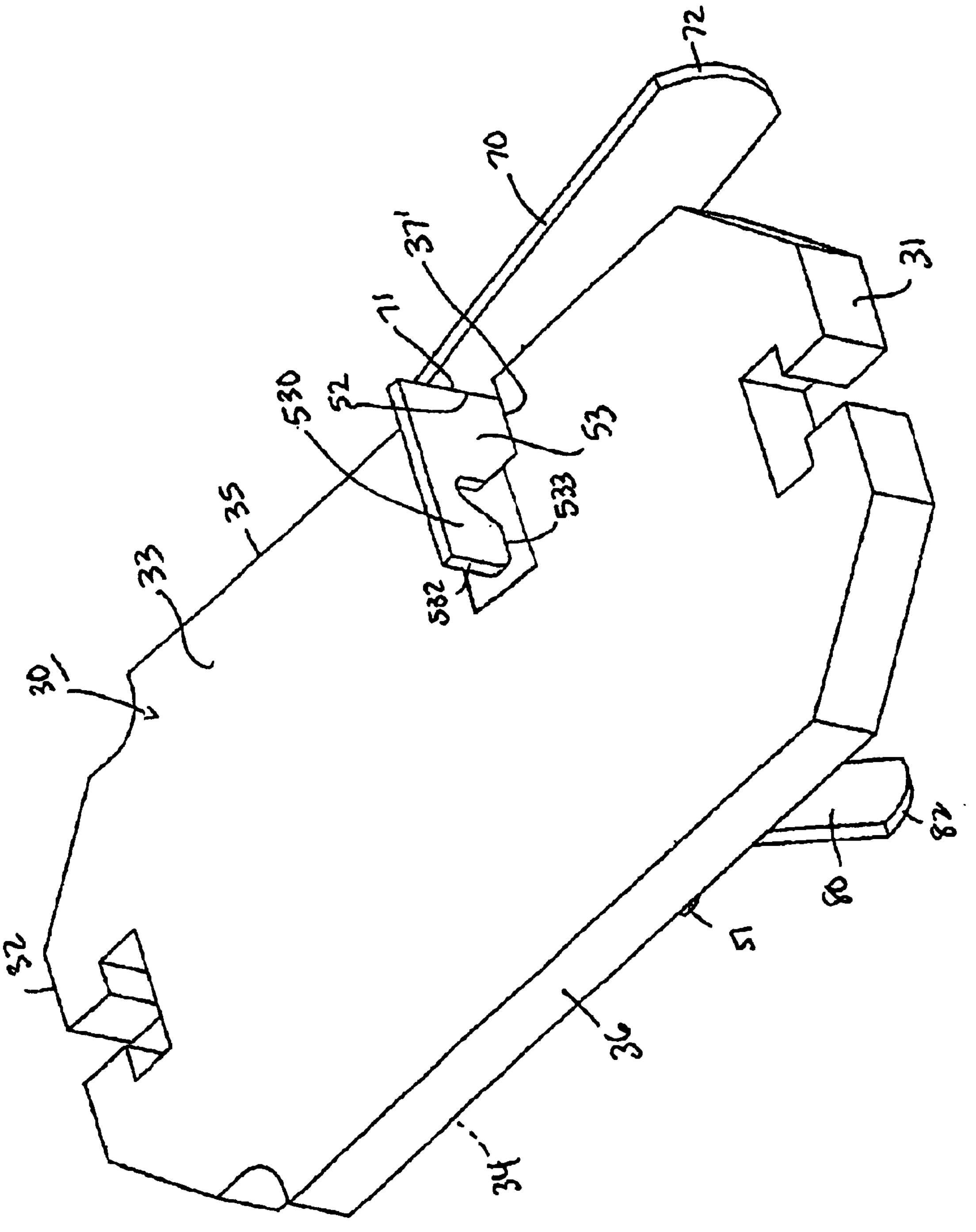
FIG. 12 is a perspective view of a circuit board and ground clip assembly according to another embodiment of the present invention.
Figure 13:
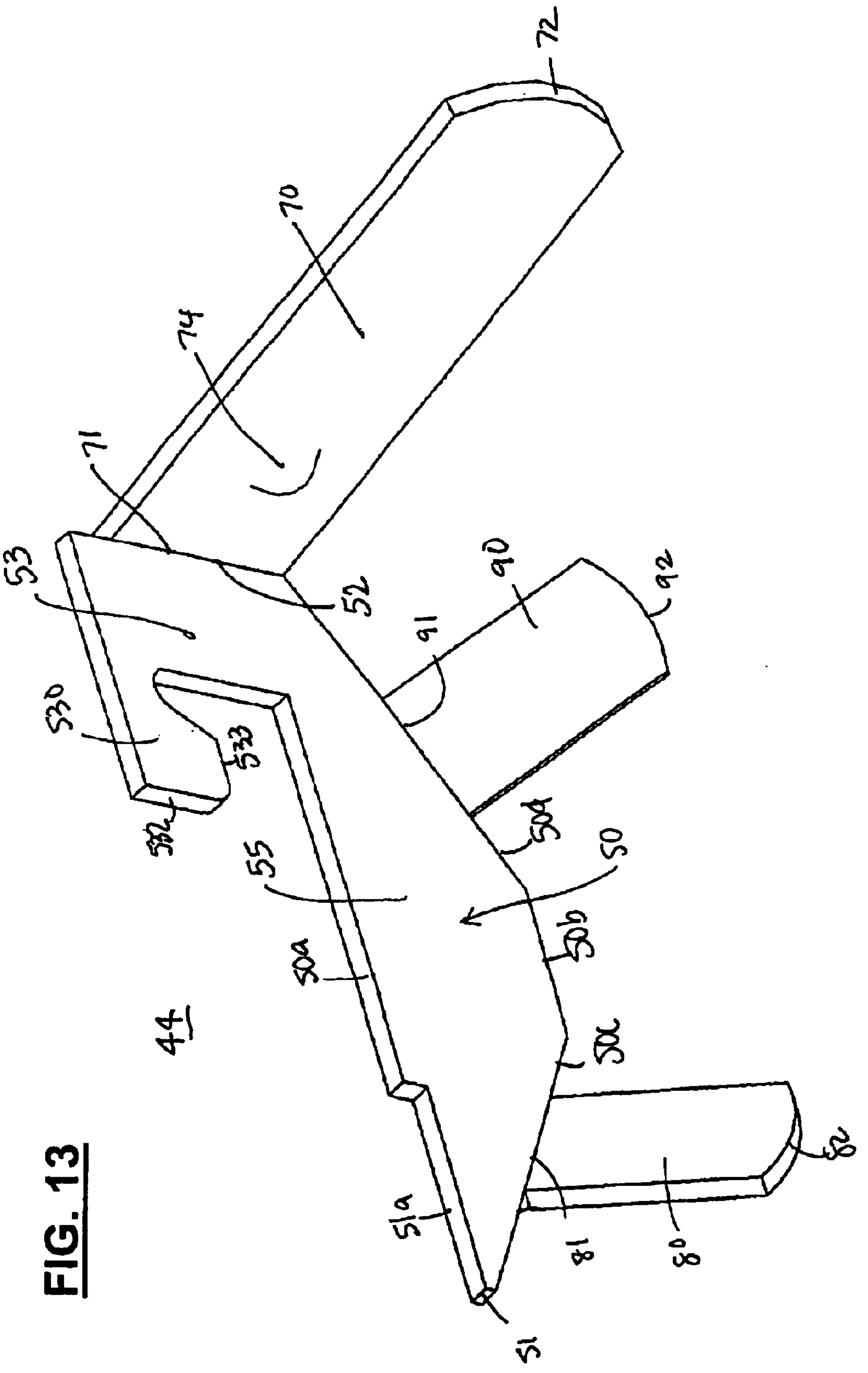
FIG. 13 is a perspective view of the ground clip shown in FIG. 12.

FIG. 12 is a perspective view of a circuit board and ground clip assembly according to another embodiment of the present invention, and FIG. 13 is a perspective view of the ground clip 44 shown in FIG. 12.

As shown, the first portion 53 of the main portion 50 of the ground clip 44 further comprises a projection 530 extending a distance from an edge portion thereof in the lateral direction beyond the terminal end 39' of the notch 37'. At least a portion 533 of the projection 530 proximate a terminal end 532 thereof is adapted to contact the first surface 33 of the circuit board proximate the terminal end 39' of the notch 37' to provide a mechanical ground connection between the circuit board 30 and the ground clip 44 in a solderless manner. As shown, it is preferred to provide a conductive pad proximate the terminal end 39' of the notch 37' to ensure a good electrical ground connection, even without solder. In this case, the single solder joint required of the embodiments described above in connection with FIGS. 6–10 is not needed.

As shown in FIG. 13, the first grounding arm 80 extends from the lower edge 50*c* of the second portion 55 of the main portion 50 of the ground clip 44 substantially in the third direction and the second grounding arm 90 extends from the lower edge 50*d* of the second portion 55 of the main portion 50 of the ground clip 44 substantially in the third direction. The distance between the respective first ends 81, 91 and the respective distal ends 82, 92 of each of the first and second grounding arms 80, 90 is preferably greater than the inner radius of the second filter housing member 20.

Grounding contact between the ground clip 44 and the second filter housing member 20 is further provided by grounding leg 70, which extends from a first end 71 thereof, which is integral with the second end 52 of the main portion 50, as shown in FIGS. 10 and 11, and is similar to the grounding leg 70 described above with respect to FIGS. 6 and 7.

The main portion 50 of the ground clip 44 shown in FIGS. 12 and 13 further comprises a notch 51 a formed on a portion thereof proximate the first end 51 thereof. Preferably, the notch 51*a* of the main portion 50 of the ground clip 44 is dimensioned to provide a spark gap with respect to a circuit pattern printed on at least the second surface 34 of the circuit board 30. That is, the distance between the second surface 34 of the circuit board 30 and the notch 51*a* on the first end 51 of the main portion 50 is sufficient to shunt a surging current to ground in the event of a power surge when the electronic signal filter is being tested or used via the ground clip 44 itself, which is in grounding contact with the first and second filter housing members 10, 20, which are, in turn, in electrical contact with a grounded portion of a coaxial cable.

While the present invention has been particularly shown and described with reference to the preferred mode as illustrated in the drawings, it will be understood by one skilled in the art that various changes in detail may be effected therein without departing from the spirit and scope of the invention as defined by the claims.

We claim:

1. An electronic signal filter, comprising:

a first filter housing member extending along a longitudinal direction from a first end thereof to an opposed second end thereof;

a second filter housing member extending along said longitudinal direction from a first end thereof, which engages at least said second end of said first filter housing member, to an opposed second end thereof;

a filter cavity defined by said first and second filter housing members;

a circuit board positioned within said filter cavity, said circuit board extending from a first end thereof toward an opposed second end thereof in said longitudinal direction and having a first surface, an opposed second surface, a first edge and an opposed second edge, and a slot that opens in said first edge of said circuit board, said slot extending in a substantially lateral direction toward a terminal end thereof proximate said second edge of said circuit board; and a ground clip for providing a ground connection between said circuit board and said first and said second filter housing members, said ground clip comprising:

a main portion having at least a first portion positioned within said slot of said circuit board, a slot-retaining portion extending from a first end thereof proximate a first end of said main portion toward a distal end thereof in said lateral direction and being positioned within said slot of said circuit board, at least one grounding arm extending from a first end thereof proximate said main portion toward an opposed distal end thereof, said grounding arm being in grounding contact with at least an inner surface of said second filter housing member, and at least one grounding leg extending from a first end thereof proximate a second end of said main portion to an opposed distal end thereof in said longitudinal direction, wherein said grounding leg extends a sufficient distance in said longitudinal direction such that at least a portion of said grounding leg is positioned in an interface between said first and said second filter housing members to achieve a secure ground contact between said circuit board, said first filter housing member, and said second filter housing member in a solderless manner.

2. The electronic signal filter of claim 1, wherein said main portion of said ground clip further comprises a second portion extending from said first surface of said circuit board in a third direction substantially perpendicular to said circuit board and a third portion extending from said second surface of said circuit board in said third direction.

3. The electronic signal filter of claim 2, wherein said second and third portions of said main portion of said ground clip are of sufficient size to provide shielding between filter components provided on at least one of said first and said second surfaces of said circuit board.

4. The electronic signal filter of claim 1, further comprising a hairpin bend between said first end of said main portion and said first end of said slot-retaining portion, such that said distal end of said slot-retaining portion extends toward said opening of said slot substantially in said lateral direction.

5. The electronic signal filter of claim 4, wherein said distal end of said slot-retaining portion comprises a first positioning member that contacts said first surface of said circuit board to prevent movement of said distal end of said slot-retaining portion in said third direction.

6. The electronic signal filter of claim 5, wherein said distal end of said slot retaining portion further comprises a second positioning member that contacts said second surface of said circuit board to prevent movement of said distal end of said slot-retaining portion in said third direction.

7. The electronic signal filter of claim 4, wherein said ground clip further comprises a notch in said hairpin bend that has a first portion dimensioned to provide a spark gap with respect to a circuit pattern provided on said circuit board.

8. The electronic signal filter of claim 7, wherein said notch extends into said first end of said main portion and said first end of said slot-retaining portion.

9. The electronic signal filter of claim 7, wherein said notch further comprises a second portion adjacent said first portion, said second portion being dimensioned to engage said circuit board and prevent movement of said grounding clip in said third direction.

10. The electronic signal filter of claim 2, wherein said at least one grounding arm comprises a first grounding arm and an opposed second grounding arm.

11. The electronic signal filter of claim 10, wherein said first grounding arm extends in said third direction from said second portion of said main portion, and said second grounding arm extends in said third direction from said third portion of said main portion, such that said first grounding arm is in grounding contact with a portion of said inner surface of said second filter housing member opposing said first surface of said circuit board, and said second grounding arm is in grounding contact with a portion of said inner surface of said second filter housing member opposing said second surface of said circuit board.

12. The electronic signal filter of claim 10, wherein a distance between said distal ends of said first and said second grounding arms is greater than an inner diameter of said second filter housing member.

13. The electronic signal filter of claim 10, wherein said first and said second grounding arms extend from said main portion in said third direction.

14. The electronic signal filter of claim 13, wherein said first and said second grounding arms are resilient such that at least a portion of said respective distal ends contacts said inner surface of said second filter housing and is deviated from said third direction toward said first end of said second filter housing in said longitudinal direction when said circuit board is inserted into said first end of said second filter housing member.

15. The electronic signal filter of claim 4, wherein said hairpin bend is sufficiently resilient such that at least said distal end of said slot-retaining portion exerts a force in said longitudinal direction away from said first portion of said main portion.

16. The electronic signal filter of claim 1, wherein said grounding leg further comprises a raised boss member opposing said first edge of said circuit board for limiting movement of said grounding leg toward said first edge of said circuit board.

17. The electronic signal filter of claim 1, wherein said second end of said first filter housing member is received within said first end of said second filter housing member.

18. The electronic signal filter of claim 17, wherein said grounding leg extends a sufficient distance in said longitudinal direction such that at least a portion of said grounding leg extends between an outer surface of said first filter housing member proximate said second end thereof and said inner surface of said second filter housing member proximate said first end thereof.

19. An electronic signal filter, comprising:

a first filter housing member extending along a longitudinal direction from a first end thereof to an opposed second end thereof;

a second filter housing member extending along said longitudinal direction from a first end thereof, which engages at least said second end of said first filter housing member, to an opposed second end thereof;

a filter cavity defined said first and second filter housing members;

a circuit board positioned within said filter cavity, said circuit board extending from a first end thereof toward an opposed second end thereof in said longitudinal direction and having a first surface, an opposed second surface, a first edge and an opposed second edge, and a slot that opens in said first edge of said circuit board, said slot extending in a substantially lateral direction toward a terminal end thereof proximate said second edge of said circuit board; and a ground clip for providing a ground connection between said circuit board and said first and said second filter housing members, said ground clip comprising a main portion having a first portion positioned within said slot of said circuit board, a slot-retaining portion extending from a first end thereof proximate a first end of said main portion toward a distal end thereof in said lateral direction and being positioned within said slot of said circuit board, a first grounding arm extending in a third direction substantially perpendicular to said surface of said circuit board from a second portion of said main portion, and a second grounding arm extending in said third direction from a third portion of said main portion, such that said first grounding arm is in grounding contact with a portion of an inner surface of said second filter housing member opposing said first surface of said circuit board and said second grounding arm is in grounding contact with a portion of said inner surface of said second filter housing member opposing said second surface of said circuit board, wherein a distance between distal ends of said first and said second grounding arms is greater than an inner diameter of said second filter housing member, and wherein said first and said second grounding arms are resilient such that at least a portion of said respective distal ends contacts said inner surface of said second filter housing and is deviated from said third direction toward said first end of said second filter housing in said longitudinal direction when said circuit board is inserted into said first end of said second filter housing member, and at least one grounding leg extending from a first end thereof proximate a second end of said main portion to an opposed distal end thereof in said longitudinal direction, wherein said grounding leg extends a sufficient distance in said longitudinal direction such that at least a portion of said grounding leg is positioned in an interface between said first and said second filter housing members to achieve a secure ground contact between said circuit board, said first filter housing member, and said second filter housing member in a solderless manner.

20. The electronic signal filter of claim 19, wherein said second and third portions of said main portion of said ground clip are of sufficient size to provide shielding between filter components provided on at least one of said first and said second surfaces of said circuit board.

21. The electronic signal filter of claim 19, further comprising a hairpin bend between said first end of said main portion and said first end of said slot-retaining portion, such that said distal end of said slot-retaining portion extends toward said opening of said slot substantially in said lateral direction.

22. The electronic signal filter of claim 21, wherein said distal end of said slot-retaining portion comprises a first positioning member that contacts said first surface of said circuit board to prevent movement of said distal end of said slot-retaining portion in said third direction.

23. The electronic signal filter of claim 22, wherein said distal end of said slot retaining portion further comprises a second positioning member that contacts said second surface of said circuit board to prevent movement of said distal end of said slot-retaining portion in said third direction.

24. The electronic signal filter of claim 21, wherein said ground clip further comprises a notch in said hairpin bend that has a first portion dimensioned to provide a spark gap with respect to a circuit pattern provided on said circuit board.

25. The electronic signal filter of claim 24, wherein said notch extends into said first end of said main portion and said first end of said slot-retaining portion.

26. The electronic signal filter of claim 24, wherein said notch further comprises a second portion adjacent said first portion, said second portion being dimensioned to engage said circuit board and prevent movement of said grounding clip in said third direction.

27. The electronic signal filter of claim 21, wherein said hairpin bend is sufficiently resilient such that at least said distal end of said slot-retaining portion exerts a force in said longitudinal direction away from said first portion of said main portion.

28. The electronic signal filter of claim 19, wherein said grounding leg further comprises a raised boss member opposing said first edge of said circuit board for limiting movement of said grounding leg toward said first edge of said circuit board.

29. The electronic signal filter of claim 19, wherein said second end of said first filter housing member is received within said first end of said second filter housing member.

30. The electronic signal filter of claim 29, wherein said grounding leg extends a sufficient distance in said longitudinal direction such that at least a portion of said grounding leg extends between an outer surface of said first filter housing member proximate said second end thereof and an inner surface of said second filter housing member proximate said first end thereof.

31. An electronic signal filter, comprising:

a first filter housing member extending along a longitudinal direction from a first end thereof to an opposed second end thereof;

a second filter housing member extending along said longitudinal direction from a first end thereof, which engages at least said second end of said first filter housing member, to an opposed second end thereof;

a filter cavity defined by said first and second filter housing members;

a circuit board positioned within said filter cavity, said circuit board extending from a first end thereof toward an opposed second end thereof in said longitudinal direction and having a first surface, an opposed second surface, a first edge and an opposed second edge, and a slot that opens in said first edge of said circuit board, said slot extending in a substantially lateral direction toward a terminal end thereof proximate said second edge of said circuit board; and a ground clip for providing a ground connection between said circuit board and said first and said second filter housing members, said ground clip comprising a main portion having at least a first portion positioned within said slot of said circuit board, a slot-retaining portion extending from a first end thereof proximate a first end of said main portion toward a distal end thereof in said lateral direction and being positioned within said slot of said circuit board, a hairpin bend between said first end of said main portion and said first end of said slot-retaining portion, such that said distal end of said slot-retaining portion extends toward said opening of said slot substantially in said lateral direction, a notch formed in said hairpin bend and having a first portion dimensioned to provide a spark gap with respect to a circuit pattern provided on said circuit board, and at least one grounding leg extending from a first end thereof proximate a second end of said main portion to an opposed distal end thereof in said longitudinal direction, wherein said grounding leg extends a sufficient distance in said longitudinal direction such that at least a portion of said grounding leg is positioned in an interface between said first and said second filter housing members to achieve a secure ground contact between said circuit board, said first filter housing member, and said second filter housing member in a solderless manner.

32. The electronic signal filter of claim 31, wherein said main portion of said ground clip further comprises a second portion extending from said first surface of said circuit board in a third direction substantially perpendicular to said circuit board and a third portion extending from said second surface of said circuit board in said third direction.

33. The electronic signal filter of claim 32, wherein said second and third portions of said main portion of said ground clip are of sufficient size to provide shielding between filter components provided on at least one of said first and said second surfaces of said circuit board.

34. The electronic signal filter of claim 31, wherein said distal end of said slot-retaining portion comprises first and second positioning members that contact said first and second surfaces of said circuit board, respectively, to prevent movement of said distal end of said slot-retaining portion in said third direction.

35. The electronic signal filter of claim 31, wherein said notch extends into said first end of said main portion and said first end of said slot-retaining portion.

36. The electronic signal filter of claim 31, wherein said notch further comprises a second portion adjacent said first portion, said second portion being dimensioned to engage said circuit board and prevent movement of said grounding clip in said third direction.

37. The electronic signal filter of claim 31, wherein said hairpin bend is sufficiently resilient such that at least said distal end of said slot-retaining portion exerts a force in said longitudinal direction away from said first portion of said main portion.

38. The electronic signal filter of claim 31, wherein said grounding leg further comprises a raised boss member opposing said first edge of said circuit board for limiting movement of said grounding leg toward said first edge of said circuit board.

39. The electronic signal filter of claim 31, wherein said second end of said first filter housing member is received within said first end of said second filter housing member.

40. The electronic signal filter of claim 39, wherein said grounding leg extends a sufficient distance in said longitudinal direction such that at least a portion of said grounding leg extends between an outer surface of said first filter housing member proximate said second end thereof and an inner surface of said second filter housing member proximate said first end thereof.

41. An electronic signal filter, comprising:

a first filter housing member extending along a longitudinal direction from a first end thereof to an opposed second end thereof;

a second filter housing member extending along said longitudinal direction from a first end thereof, which engages at least said second end of said first filter housing member, to an opposed second end thereof;

a filter cavity defined by said first and second filter housing members;

a circuit board positioned within said filter cavity, said circuit board extending from a first end thereof toward an opposed second end thereof in said longitudinal direction and having a first surface, an opposed second surface, a first edge and an opposed second edge, and a notch having a first end that opens in said first edge of said circuit board, said notch extending a distance in a substantially lateral direction toward said second edge of said circuit board to a terminal end thereof; and a ground clip for providing a ground connection between said circuit board and said first and said second filter housing members, said ground clip comprising a main portion extending from a first end to an opposed second end thereof in said lateral direction, said main portion having at least a first portion proximate said second end thereof positioned within said notch of said circuit board, said first portion of said main portion extending a distance beyond one of said first and said second surfaces of said circuit board in a third direction substantially perpendicular to said circuit board, at least one grounding arm extending from a first end thereof proximate said main portion toward an opposed distal end thereof, said grounding arm being in grounding contact with at least an inner surface of said second filter housing member, and at least one grounding leg extending from a first end thereof proximate a second end of said main portion to an opposed distal end thereof in said longitudinal direction;

wherein said grounding leg extends a sufficient distance in said longitudinal direction such that at least a portion of said grounding leg is in grounding contact with at least said inner surface of said second filter housing member to achieve a secure ground contact between said circuit board, said first filter housing member, and said second filter housing member in a solderless manner.

42. The electronic signal filter of claim 41, wherein a distance between said first end of said notch and said terminal end of said notch is in a range of 0.025 to 0.065 inches.

43. The electronic signal filter of claim 41, wherein said main portion of said ground clip further comprises a second portion extending from the other one of said first and said second surfaces of said circuit board said third direction.

44. The electronic signal filter of claim 43, wherein said second portion of said main portion of said ground clip is of sufficient size to provide shielding between filter components provided on said other one of said first and said second surfaces of said circuit board.

45. The electronic signal filter of claim 41, wherein said at least one grounding arm comprises a first grounding arm and a second grounding arm.

46. The electronic signal filter of claim 45, wherein said first grounding arm extends from one portion of said second portion of said main portion of said ground clip and wherein said second grounding arm extends from another portion of said second portion of said main portion of said ground clip.

47. The electronic signal filter of claim 46, wherein a distance between said first and said distal ends of each said first and said second grounding arms is greater than an inner radius of said second filter housing member.

48. The electronic signal filter of claim 46, wherein said first grounding arm extends from a lower edge portion of said second portion of said main portion of said ground clip substantially in said third direction and wherein said second grounding arm extends from another lower edge of said second portion of said main portion of said ground clip substantially in said third direction.

49. The electronic signal filter of claim 43, wherein said main portion of said ground clip further comprises a notch formed on a portion thereof proximate said first end thereof, said notch of said main portion of said ground clip being dimensioned to provide a spark gap with respect to a circuit pattern printed on said other one of said first and said second surfaces of said circuit board.

50. The electronic signal filter of claim 45, wherein said first portion of said main portion of said ground clip further comprises a projection extending a distance from an edge portion thereof in said lateral direction beyond said terminal end of said notch, at least a portion of said projection being adapted to contact said one of said first and said second surfaces of said circuit board proximate said terminal end of said notch to provide a mechanical ground connection between said circuit board and said ground clip in a solderless manner.

51. The electronic signal filter of claim 41, wherein said circuit board further comprises an opening passing from said first surface to said second surface thereof, said opening being formed in a substantially central location laterally positioned between said first edge and said second edge of said circuit board, said opening having a central lateral axis that is substantially coaxial with a central lateral axis of said notch.

52. The electronic signal filter of claim 51, wherein said opening in said circuit board is one of an elongate slot and a substantially circular through-hole.

53. The electronic signal filter of claim 51, wherein said main portion of said ground clip further comprises a second portion extending from the other one of said first and said second surfaces of said circuit board said third direction.

54. The electronic signal filter of claim 53, wherein said second portion of said main portion of said ground clip is of sufficient size to provide shielding between filter components provided on said other one of said first and said second surfaces of said circuit board.

55. The electronic signal filter of claim 53, wherein said at least one grounding arm comprises a first grounding arm and a second grounding arm.

56. The electronic signal filter of claim 55, wherein said first and said second grounding arms respectively extend from said main portion of said ground clip in different respective locations.

57. The electronic signal filter of claim 56, further comprising a third grounding arm extending from a first end thereof proximate yet another location on said main portion of said ground clip toward a distal end thereof in said third direction.

58. The electronic signal filter of claim 56, wherein said first grounding arm extends from one portion of said second portion of said main portion of said ground clip and wherein said second grounding arm extends from another portion of said second portion of said main portion of said ground clip.

59. The electronic signal filter of claim 57, wherein said third grounding arm extends from an upper edge of said second portion of said main portion of said ground clip, passes through said opening in said circuit board and extends a distance beyond said one of said first and said second surfaces of said circuit board.

60. The electronic signal filter of claim 59, wherein said third grounding arm further comprises a hairpin bend positioned between said one of said first and said second surfaces of said circuit board and said distal end of said third grounding arm, wherein said third grounding arm is bent at said hairpin bend to extend back toward said opening of said circuit board such that said distal end of said third grounding arm is proximate said one of said first and said second surfaces of said circuit board.

61. The electronic signal filter of claim 59, wherein said circuit board further comprises a conductive pad positioned proximate said opening on at least one said one of said first and said second surfaces of said circuit board.

62. The electronic signal filter of claim 61, wherein said distal end of said third grounding arm contacts said conductive pad.

63. The electronic signal filter of claim 59, wherein said third grounding arm further comprises a substantially perpendicular bend positioned between said one of said first and said second surfaces of said circuit board and said distal end of said third grounding arm, wherein said third grounding arm is bent at said substantially perpendicular bend to extend in said longitudinal direction such that said distal end of said third grounding arm is proximate said one of said first and said second surfaces of said circuit board.

64. The electronic signal filter of claim 63, wherein said circuit board further comprises a conductive pad positioned proximate said opening on at least one said one of said first and said second surfaces of said circuit board.

65. The electronic signal filter of claim 64, wherein said distal end of said third grounding arm contacts said conductive pad.

66. The electronic signal filter of claim 57, wherein said first grounding arm extends from an upper edge of said second portion of said main portion in said third direction and through said opening, wherein said second grounding arm extends from a lower edge of said second portion of said main portion in said third direction, and wherein said first grounding arm is in grounding contact with a portion of said inner surface of said second filter housing member opposing said one of said first and said second surface of said circuit board, and said second grounding arm is in grounding contact with a portion of said inner surface of said second filter housing member opposing said other one of said first and said second surface of said circuit board.

67. The electronic signal filter of claim 66, wherein a distance between said distal end of said first grounding arm and said distal end of said second grounding arm is greater than an inner diameter of said second filter housing member.

68. The electronic signal filter of claim 66, wherein said first and said second grounding arms are resilient such that at least a portion of said respective distal ends contacts said inner surface of said second filter housing and is deviated from said third direction toward said first end of said second filter housing in said longitudinal direction when said circuit board is inserted into said first end of said second filter housing member.

69. The electronic signal filter of claim 57, wherein said first grounding arm extends from a lateral edge of said second portion of said main portion proximate said first end of said main portion in said longitudinal direction, wherein said second grounding arm extends from a lower portion of said second portion of said main portion in said third direction, and wherein said first and said second grounding arms are in grounding contact with respective portions of said inner surface of said second filter housing member opposing said other one of said first and said second surface of said circuit board.

70. The electronic signal filter of claim 69, wherein a distance between said first end and said distal end of each said first and said second grounding arms is greater than an inner radius of said second filter housing member.

71. The electronic signal filter of claim 56, wherein said circuit board further comprises another notch having a first end that opens in said second edge of said circuit board, said another notch extending a distance in said lateral direction toward a terminal end thereof, said another notch substantially opposing said notch in said lateral direction.

72. The electronic signal filter of claim 71, wherein said main portion of said ground clip further comprises a third portion proximate said first end thereof, said third portion being positioned within said another notch of said circuit board and extending a distance beyond said one of said first and said second surfaces of said circuit board in said third direction.

73. The electronic signal filter of claim 72, wherein said first grounding arm extends from said third portion of said main portion of said ground clip in said longitudinal direction, wherein said second grounding arm extends from a lower edge of said second portion of said main portion in said third direction, and wherein said first and said second grounding arms are in grounding contact with respective portions of said inner surface of said second filter housing member opposing said other one of said first and said second surface of said circuit board.

74. The electronic signal filter of claim 73, wherein a distance between said first and said distal ends of each said first and said second grounding arms is greater than an inner radius of said second filter housing member.

75. The electronic signal filter of claim 41, wherein said grounding leg further comprises a raised boss member opposing said first edge of said circuit board for limiting movement of said grounding leg toward said first edge of said circuit board.

76. The electronic signal filter of claim 41, wherein said second end of said first filter housing member is received within said first end of said second filter housing member.

77. The electronic signal filter of claim 76, wherein said grounding leg extends a sufficient distance in said longitudinal direction such that at least a portion of said grounding leg extends between an outer surface of said first filter housing member proximate said second end thereof and said inner surface of said second filter housing member proximate said first end thereof.

* * * * *